(12) United States Patent
Veliadis

(10) Patent No.: US 8,106,422 B2
(45) Date of Patent: Jan. 31, 2012

(54) SIC AVALANCHE PHOTODIODE WITH IMPROVED EDGE TERMINATION

(75) Inventor: John V. Veliadis, Hanover, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 0 days.

(21) Appl. No.: 12/906,084

(22) Filed: Oct. 16, 2010

(65) Prior Publication Data

US 2011/0024768 A1 Feb. 3, 2011

Related U.S. Application Data

(62) Division of application No. 11/687,806, filed on Mar. 19, 2007, now Pat. No. 7,863,647.

(51) Int. Cl.
*H01L 31/107* (2006.01)
(52) U.S. Cl. .............. 257/186; 257/438; 257/E31.063
(58) Field of Classification Search .............. 257/186, 257/438, E31.063
See application file for complete search history.

(56) References Cited

U.S. PATENT DOCUMENTS

| | | | |
|---|---|---|---|
| 3,959,646 A | 5/1976 | De Cremoux |
| 4,857,982 A | 8/1989 | Forrest |
| 4,904,608 A | 2/1990 | Gentner et al. |
| 5,654,578 A | 8/1997 | Watanabe |
| 5,843,804 A | 12/1998 | Su et al. |
| 5,866,936 A | 2/1999 | Hasnain et al. |
| 6,359,322 B1 | 3/2002 | Haralson et al. |
| 6,791,124 B2 | 9/2004 | Hiraoka et al. |
| 6,838,741 B2 | 1/2005 | Sandvik et al. |
| 6,936,868 B2 | 8/2005 | Hiraoka et al. |
| 7,009,228 B1 | 3/2006 | Yu |
| 7,091,527 B2 | 8/2006 | Yoneda et al. |
| 2004/0245592 A1 | 12/2004 | Harmon et al. |
| 2005/0051784 A1 | 3/2005 | Niigaki et al. |
| 2006/0175529 A1 | 8/2006 | Harmon et al. |
| 2006/0249747 A1 | 11/2006 | Shushakov et al. |

OTHER PUBLICATIONS

J. Jackson, A. Morrison, D. Phelan, and A. Mathewson, "A Novel Silicon Geiger-Mode Avalanche Photodiode", Proceedings IEDM, 32-2, 2002.
X. Guo, A. Beck, X. Li, and J. Campbell, "Study of reverse dark current in 4H-SiC avalanche photodiodes", IEEE J. of Quantum Electron., vol. 41, No. 4, pp. 562-567, 2005.
P. Bhattacharya, "Semiconductor Optoelectronic Devices", 2nd ed., p. 386, 1997, selected pages.
X. Guo, L. Rowland, G. Dunne, J. Fronheiser, P. Sandvik, A. Beck, and J. Campbell, "Demonstration of Ultraviolet Separate Absorption and Multiplication 4H-SiC Avalanche Photodiodes", IEEE Photon. Technol. Lett., vol. 18, pp. 136-138, 2006.
A. Beck, B. Yang, X. Guo, and J. Campbell, "Edge Breakdown in 4H-SiC Avalanche Photodiodes", IEEE J. of Quantum Electron., vol. 40, No. 3, pp. 321-324, 2004.

(Continued)

*Primary Examiner* — Ori Nadav
*Assistant Examiner* — Jesse Y Miyoshi
(74) *Attorney, Agent, or Firm* — Marsteller & Associates, P.C.

(57) ABSTRACT

An avalanche photodiode semiconductor device (20) for converting an impinging photon (22) includes a base n+ doped material layer (52) formed having a window section (72) for passing the photon (22). An n− doped material layer (30) is formed on the n+ doped material layer (52) having a portion of a lower surface (74) suitably exposed. An n+ doped material layer (32) is formed on the n− doped material (30). A p+ layer (24) formed on top of the n+ doped layer (32). At least one guard ring (26) is formed in the n− doped layer (30).

35 Claims, 16 Drawing Sheets

OTHER PUBLICATIONS

A. Beck, G. Karve, S. Wang, J. Ming, X. Guo, and J. Campbell, "Geiger Mode Operation of Ultraviolet 4H-SiC Avalanche Photodiodes", IEEE Photon. Technol. Lett., vol. 17, pp. 1507-1509, 2005.

S. G. Sridhara et al., "Absorption coefficient of 4H silicon carbide from 3900 to 3250 A", J. Appl. Phys., vol. 84, No. 5, pp. 2963-2694, 1988.

B. K. Ng et al., "Nonlocal Effects in Thin 4H-SiC UV Avalanche Photodiodes", IEEE Transactions on Electron Devices, vol. 50, No. 8, 2003.

F. Yan, C. Qin, J. H. Zhao, and M. Weiner, "Novel technology for the formation of a very small bevel angle for edge termination," in Mater. Sci. Forum, vol. 389-393, 2002, pp. 1305-1308.

"Silicon Processing for the VLSI ERA, vol. 1—Process Technology" S. Wolf and R. N. Tauber, Lattice Press 1986.

SIC AVALANCHE PHOTODIODE WITH IMPROVED EDGE TERMINATION

CROSS REFERENCE TO RELATED APPLICATIONS

This application is a Divisional of U.S. application Ser. No. 11/687,806, filed on Mar. 19, 2007.

BACKGROUND OF THE INVENTION

1. Technical Field

The invention relates to the field of semiconductor technology and, more particularly, to systems and methods relating avalanche photodiode type semiconductor devices.

2. Background Art

Avalanche photodiodes (APDs) are essentially reverse-biased p-n junctions that are operated at voltages close to the breakdown voltage. Photogenerated carriers in the depletion region of the p-n junction travel at their saturated velocities, and if they acquire enough energy from the field during such transit, an ionizing collision with the lattice can occur. In the process, secondary electron-hole pairs are produced, which again drift in opposite directions, together with the primary carrier, and all or some of them may produce new carriers. This impact ionization leads to carrier multiplication and gain.

In Geiger mode operation, for a short period of time, the APD reverse bias is raised above the breakdown voltage. Above breakdown voltage, an unlimited amount of current can flow through the APD if not in some way controlled. To achieve breakdown, carriers must be present in the p-n depletion region. If not, it is possible to operate the APD above breakdown voltage simply because there are no current carriers to multiply and so no avalanche breakdown takes place. However, the APD has dark carriers (non-photo generated carriers) which primarily originate from thermal generation-recombination, tunneling, and quenching-circuit after-pulsing associated with trapping effects due to material defects. Multiplication of these carriers leads to false detection events (dark counts) and is undesirable. In Geiger mode, the APD is operated by exceeding breakdown voltage for such a short period of time that the probability of a dark current carrier being multiplied is small. A circuit quenches the APD current before it becomes catastrophic.

It is known that an important issue with APDs integrated into system arrays and operated in Geiger mode is breakdown voltage non-uniformity. Should APDs with disparate breakdown voltages be included in the same array, the applied voltage pulse that biases the APDs beyond breakdown, will need to surpass the highest breakdown voltage value of all individual APDs. This can dramatically increase the dark-count-rate (number of false detections), as is shown in FIG. 1 for a Si APD, as numerous APDs will be pulsed well above their breakdown voltages. J. Jackson, A. Morrison, D. Phelan, and A. Mathewson, "A Novel Silicon Geiger-Mode Avalanche Photodiode", Proceedings IEDM, 32-2, 2002. If breakdown voltage uniformity is to be maintained for low dark count rates, "cherry-picking" selection of APDs with closely matched voltage breakdowns needs to be done. Alternatively, to maintain low dark count rates, complex circuitry needs to be incorporated in the APD array in order to bias each APD slightly above its individual voltage breakdown value. Either approach substantially increases APD array system cost.

It is known that Silicon Carbide (SiC) APDs must be operated at a very high gain of >100 to make single photon detection in Geiger mode possible. Premature edge breakdown and the associated increase in dark current, limit SiC APD operation to relatively low gains. It is well known that employing a sidewall bevel angle in a MESA type APD can suppress the onset of edge breakdown to a certain extent. However, for the high gain levels needed for Geiger mode operation, the non-uniform breakdown increases dramatically between the device contact and edges. Two-dimensional raster scan photocurrent measurements of a state of the art APD, at gains of 50, 130, and 1000 are shown in FIGS. 2 to 4, respectively. A. Beck, B. Yang, X. Guo, and J. Campbell, "Edge Breakdown in 4H—SiC Avalanche Photodiodes", IEEE J. of Quantum Electron., vol. 40, No. 3, pp. 321-324, 2004. At a gain of about 1000, non-uniform breakdown manifests itself at the edge of the device. This non-uniformity is primarily due to field crowding at the device edges and sets an upper limit to the gain attainable by the APD.

It is known that the excessive leakage current and premature breakdown at the APD junction edges can be alleviated by incorporating a plurality of planar guard rings around the periphery of the APD. An example of a planar guard ring structure 42 is shown in prior art FIG. 5. See, U.S. Pat. No. 4,857,982.

It is known that an APD can be front or back side illuminated depending on the specifics of the application and the design.

It is also known that for solar blind applications (wavelength below 280 nm), using 4H—SiC Avalanche Photo Diodes (APDs) hole-initiated impact ionization is necessary to minimize excess noise. X. Guo, L. Rowland, G. Dunne, J. Fronheiser, P. Sandvik, A. Beck, and J. Campbell, "Demonstration of Ultraviolet Separate Absorption and Multiplication 4H—SiC Avalanche Photodiodes", IEEE Photon. Technol. Lett., vol. 18, pp. 136-138, 2006; and, S. G. Sridhara et al., "Absorption coefficient of 4H silicon carbide from 3900 to 3250 A", J. Appl. Phys., vol. 84, no. 5, pp. 2963-2694, 1988. This is due to the disparate hole and electron impact ionization coefficients in 4H—SiC, which result in very low k values (k of about 0.02 is the ratio of the electron and hole impact ionization coefficients in SiC) for hole initiated impact ionization.

Prior Art Solar Blind SiC APD Design 1:

Hole-initiated impact ionization is taking place in the structure of FIG. 6. At solar blind UV wavelengths, the photons are predominately absorbed in the 1500 nm n– absorption region. The created electron and hole are accelerated by the field in opposite directions. Only the hole is injected in the high electric-field multiplication region (n+ 120 nm thick) and it's this virtually pure hole-initiated impact ionization that leads to low excess noise. A p-doped SiC substrate overlaid by n-doped epitaxial layers is the preferable structure. However, since commercial p-doped SiC substrates have higher defect densities compared to n-doped substrates, an n-doped substrate with a 2 μm thick p-doped epitaxial layer was used in FIG. 6. X. Guo, L. Rowland, G. Dunne, J. Fronheiser, P. Sandvik, A. Beck, and J. Campbell, "Demonstration of Ultraviolet Separate Absorption and Multiplication 4H—SiC Avalanche Photodiodes", IEEE Photon. Technol. Lett., vol. 18, pp. 136-138, 2006.

There are two drawbacks to this approach:

1. The p-type metal contacts have to be lateral which creates a very resistive path (through a less than 2 μm corridor), compared to a metal contact at the bottom of the substrate. This increases the APD's RC time constant, which results in higher dark counts (false detections). An RC constant as short as possible is essential for reducing the recovery time for passive quenching and the gate-length for gated passive quenching in Geiger mode operation. A. Beck, G. Karve, S. Wang, J. Ming, X. Guo, and J. Campbell, "Geiger Mode Operation of Ultraviolet 4H—SiC Avalanche Photodiodes", *IEEE Photon. Technol. Lett.*, vol. 17, pp. 1507-1509, 2005. A high RC time constant also reduces APD bandwidth.

2. n-doped epitaxial layers grown over the heavily doped p+ region, which acts as a substrate, have higher defect densities and thus dark current is increased. The defects trap carriers. When the breakdown voltage is exceeded by a gate pulse in Geiger mode operation, the carriers trapped in defects can be freed and initiate avalanche multiplication, which increases the dark count rate. This is known as afterpusling. J. Jackson, A. Morrison, D. Phelan, and A. Mathewson, "A Novel Silicon Geiger-Mode Avalanche Photodiode", Proceedings IEDM, 32-2, 2002.

The structure and p-type lateral metal contacts are shown in FIG. 6. The low excess noise factor for the structure of FIG. 6, for the hole initiated impact ionization at 280 nm is shown in FIG. 7(*a*). The relatively high dark current, due to the inevitable incorporation of defects when growing epitaxial layers on top of highly doped p– type SiC material is shown in FIG. 7(*b*).

Prior Art Solar Blind SiC APD Design 2:

In the structure of FIG. 8, epitaxial growth over an n+4H—SiC substrate minimizes dark current due to the commercially available good substrate material quality and the ability to grow low-defect layers on top of n+. The low dark current of this design is shown in FIG. 9. X. Guo, A. Beck, X. Li, and J. Campbell, "Study of reverse dark current in 4H—SiC avalanche photodiodes", *IEEE J. of Quantum Electron.*, vol. 41, No. 4, pp. 562-567, 2005. In this structure where the photon impinges on p+ material, however, the advantage of low dark current due to epitaxial growth quality is accompanied by the disadvantage of relatively high excess noise due to the mixed electron and hole injection at the >280 nm wavelength of interest, FIG. 10. B. K. Ng et al., "Nonlocal Effects in Thin 4H—SiC UV Avalanche Photodiodes", IEEE Transactions on Electron Devices, Vol. 50, No. 8, 2003.

For a structure where the photon impinges on p-doped material (similar to FIG. 8), the weakly absorbed 365 nm light gives a mixed carrier initiated multiplication that is close to pure hole multiplication; the excess noise is very low as seen from the measured data at 365 nm, FIG. 10. As the wavelength decreases below 365 nm, light is progressively absorbed at shorter depths and more electrons are injected from the p-doped layers leading to an increase in excess noise. At 230 nm, the majority of the UV light is absorbed in the p-doped layers so the multiplication characteristic corresponds to pure electron multiplication. This leads to high excess noise as seen by the 230 nm symbols in FIG. 10.

While the above cited references introduce and disclose a number of noteworthy advances and technological improvements within the art, none completely fulfills the specific objectives achieved by this invention.

DISCLOSURE OF INVENTION

In accordance with the present invention, an avalanche photodiode semiconductor device of the type for converting an impinging photon into an electrical current includes a base n+ doped material layer formed having a window section for passing the photon impinging on the avalanche photodiode device. An n– doped material layer is formed on the n+ doped material layer with the n– doped material layer having a portion of a lower surface suitably exposed for receiving the photon impinging on the avalanche photodiode device. An n+ doped material layer is similarly formed on the n– doped material with the n– doped material layer being located between the base n+ doped material layer and the n+ doped material layer. A p+ doped material layer is formed on top of the n+ doped layer such that the n+ doped layer is formed sandwiched between the n– doped layer and the p+ doped layer. At least one guard ring is formed in the n– doped layer and separated from the n+ doped and the p+ doped material layers.

These and other objects, advantages and preferred features of this invention will be apparent from the following description taken with reference to the accompanying drawings, wherein is shown the preferred embodiments of the invention.

BRIEF DESCRIPTION OF DRAWINGS

A more particular description of the invention briefly summarized above is available from the exemplary embodiments illustrated in the drawings and discussed in further detail below. Through this reference, it can be seen how the above cited features, as well as others that will become apparent, are obtained and can be understood in detail. The drawings nevertheless illustrate only typical, preferred embodiments of the invention and are not to be considered limiting of its scope as the invention may admit to other equally effective embodiments.

FIG. 7(*b*) shows a graph with relatively high dark current, due to the inevitable incorporation of defects when growing epitaxial layers on top of highly doped p-doped material (device diameter 100 μm).

MODE(S) FOR CARRYING OUT THE INVENTION

Figure 1:
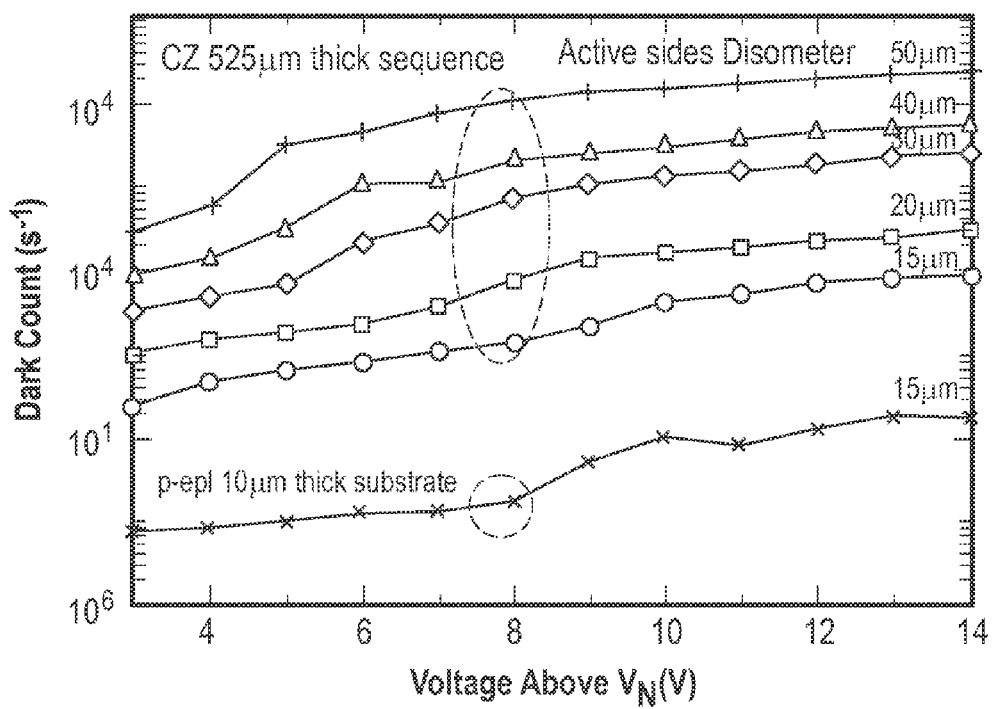
FIG. 1 shows measured dark counts (false detections) for 15, 20, 30, 40, and 50 μm diameter circular Geiger mode biased APDs, measured at biases of 3 to 14 V above the breakdown voltage using an active quench circuit with a hold-off time of 200 ns.
Figure 2:
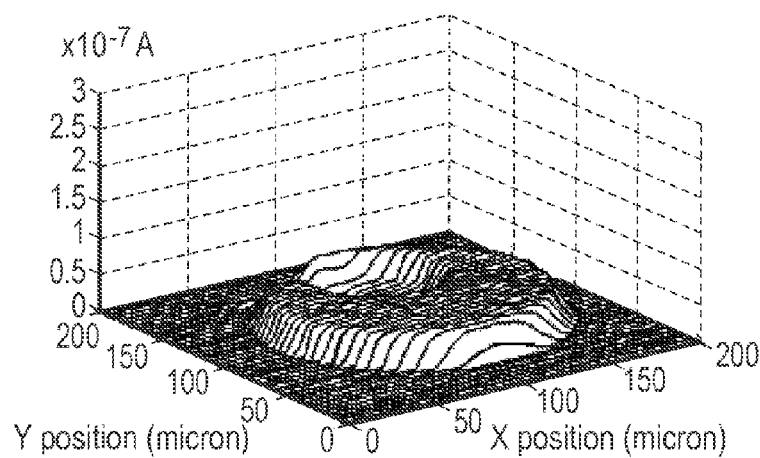
FIGS. 2 to 4 show two-dimensional raster scan photocurrent measurements at gains of 50, 130, and 1000, respectively.
Figure 3:
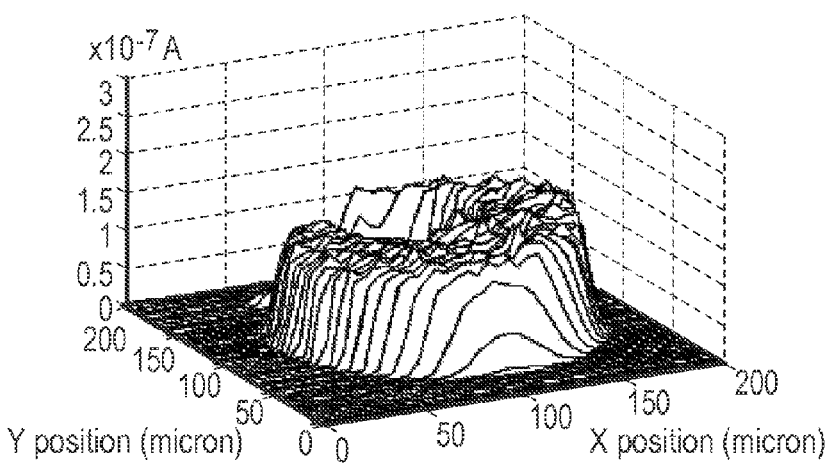

So that the manner in which the above recited features, advantages and objects of the present invention are attained can be understood in detail, more particular description of the invention, briefly summarized above, may be had by reference to the embodiment thereof that is illustrated in the appended drawings. In all the drawings, identical numbers represent the same elements.

The present application relates to an earlier filed application entitled "SYSTEMS AND METHODS FOR MAXIMIZING BREAKDOWN VOLTAGE IN SEMICONDUCTOR DEVICES," Ser. No. 11/601,064, filed Nov. 17, 2006, the disclosure of which is incorporated herein as if fully set forth.

An avalanche photodiode semiconductor device 20 of the type for converting an impinging photon 22 into an electrical current includes a base n+ doped material layer 52 formed having a window section 72 for passing the photon 22 impinging on the avalanche photodiode device 20. The base n+ doped material layer 52 can be a commercially available 4H—SiC substrate which is doped at approximately $5 \times 10^{18}$ $cm^{-3}$ with an n+ buffer layer superimposed on top of said substrate with an approximate thickness of 1 μm and an approximate doping concentration of $1 \times 10^{18}$ $cm^{-3}$. The thin buffer layer facilitates with epitaxial growth of subsequent device layers. The combined substrate and buffer layer will be hereafter referred to as "substrate". An n− doped material layer 30 is formed on the n+ doped material layer 52 with the n− doped material layer 30 having a portion of a lower surface 74 suitably exposed for receiving the photon 22 impinging on the avalanche photodiode device 20. An n+ doped material layer 32 is similarly formed on the n− doped material layer 30 with the n− doped material layer 30 being located between the n+ doped material layer 52 and the n+ doped material layer 32. A p+ doped layer 24 is formed on top of the n+ doped layer 32 such that the n+ doped layer 32 is formed sandwiched between the n− doped layer 30 and the p+ doped layer 24. In one embodiment, at least one guard ring 26 is formed in the n− doped layer 30 and separated from the n+ doped and the p+ doped material layers 32 and 24, respectively. In another embodiment, at least one guard ring 26 is formed in the n+ doped layer 32 and separated from the p+ doped material layer 24.

Figure 11:
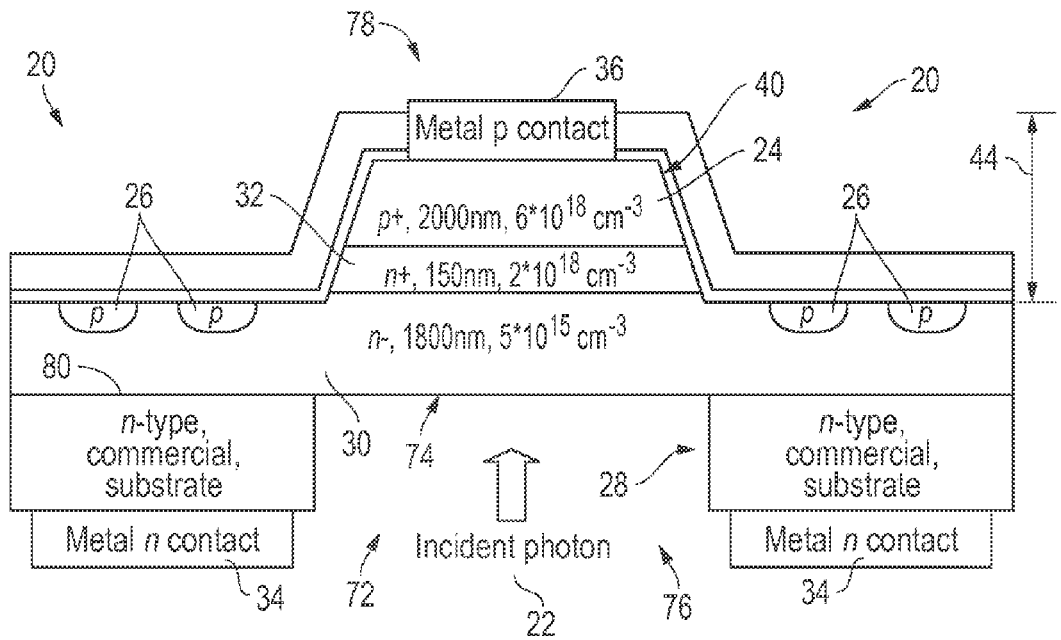
FIG. 11 is a cross-sectional view of one embodiment of the present invention for low excess noise, low contact resistance, low dark current, and low dark count for 280 nm UV blind Geiger mode APD operation.

To achieve voltage breakdown uniformity in APDs with same design parameters and to minimize dark current, the present invention discloses a structure that makes use of floating guard ring edge termination. A state of the art silicon carbide (SiC) avalanche photodiode (APD) MESA type structure 20 is shown in FIG. 11 with the photon 22 impinging on the n− material 30 and the disclosed guard rings 26 present. The implanted guard rings 26 are shown located in their entirety within the n− layer 30. In another embodiment (not shown) the implanted guard rings 26 can be in part or in their entirety located within the n+ layer 32. Their numbers, thickness and spacings can be optimized for a given APD epitaxy. While not shown, it should be understood that the plurality of guard rings essentially "ring" the n+ and p+ layers 32 and 24, respectively, as is known.

Figure 7A:
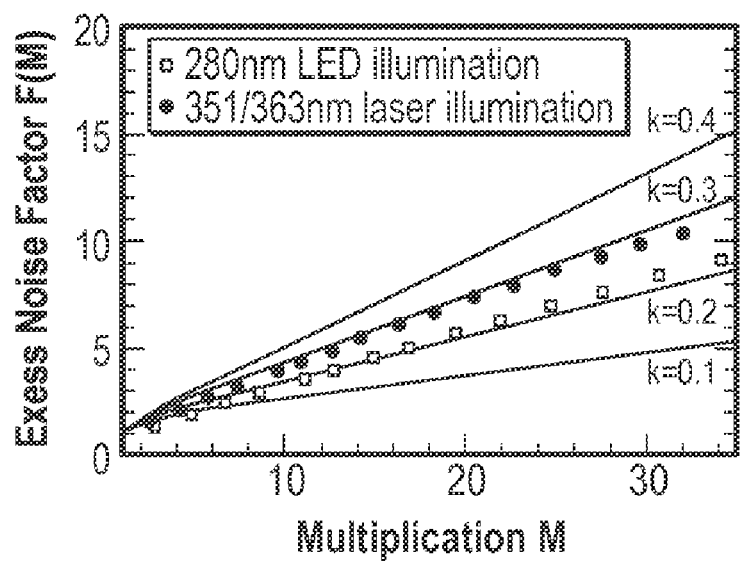
FIG. 7(*a*) shows a graph with low excess noise factor at 280 nm for hole-initiated impact ionization using the structure depicted in FIG. 6.
Figure 7B:
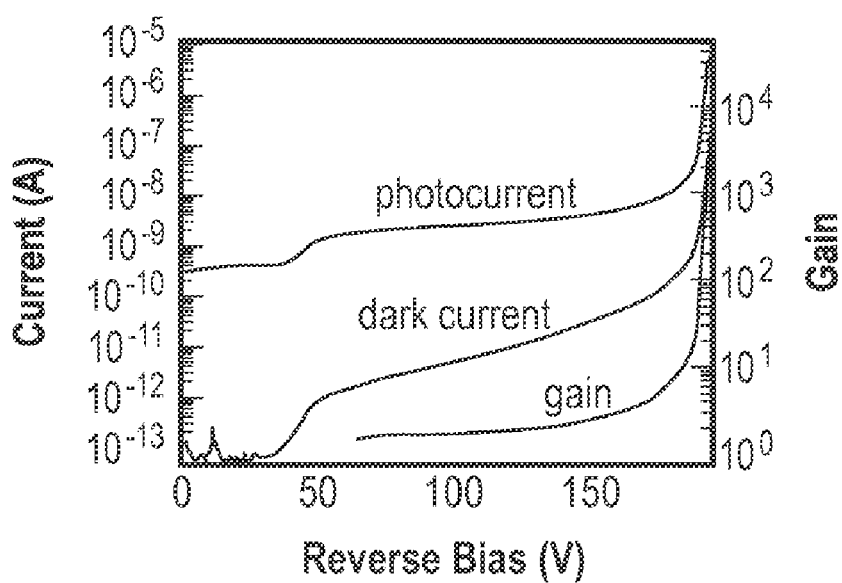
Figure 8:
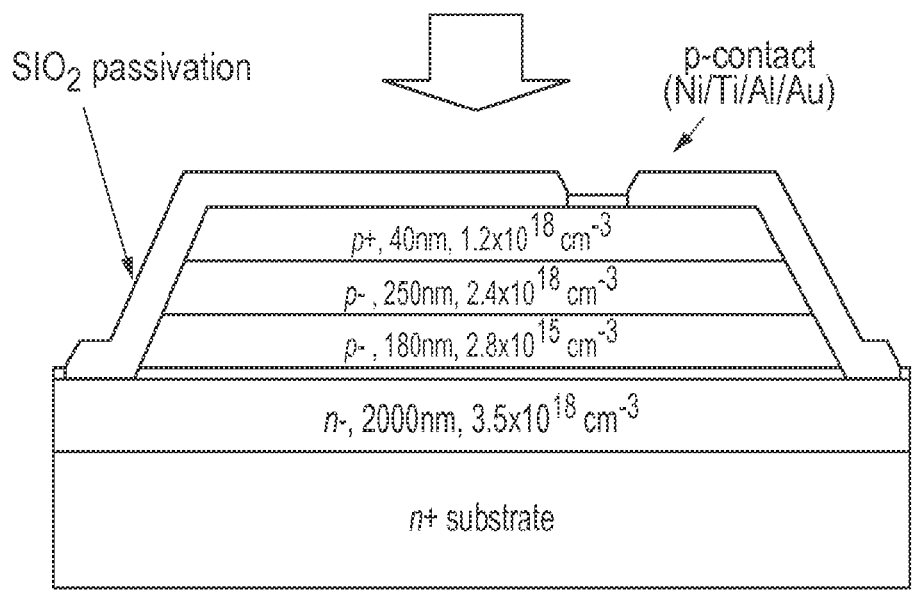
FIG. 8 is a cross-sectional view of a prior art high SiC material quality UV APD design for low dark current.
Figure 9:
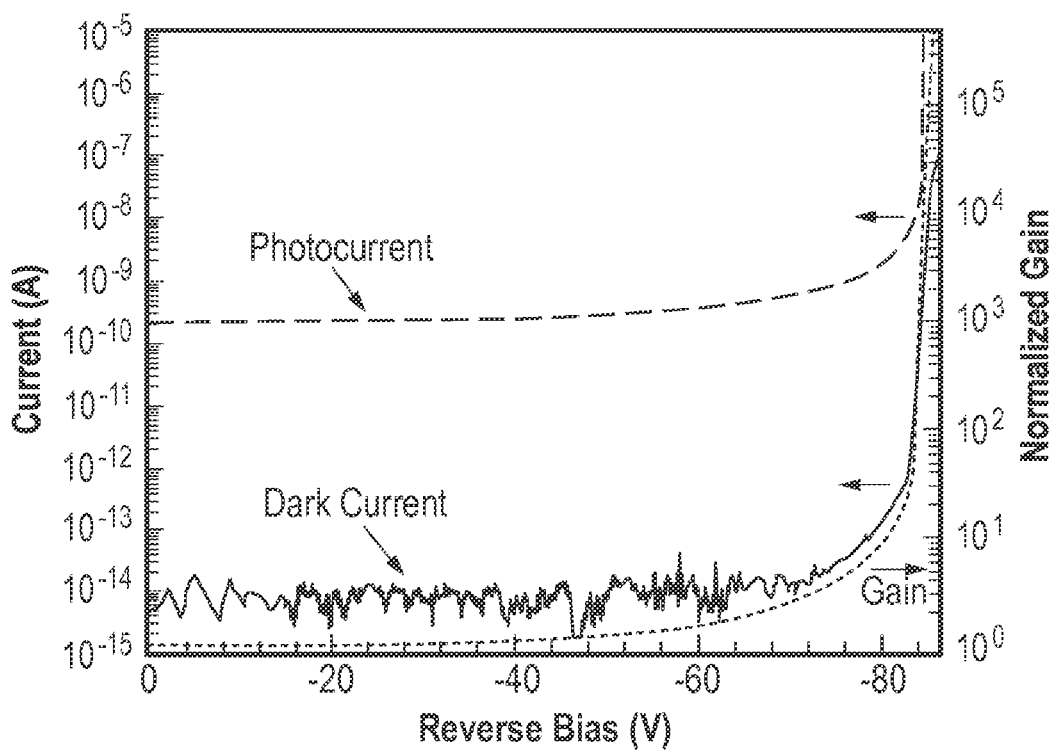
FIG. 9 is a graph showing relatively low dark current for the 100 μm device of FIG. 8, which is grown on an n+ doped substrate.
Figure 10:
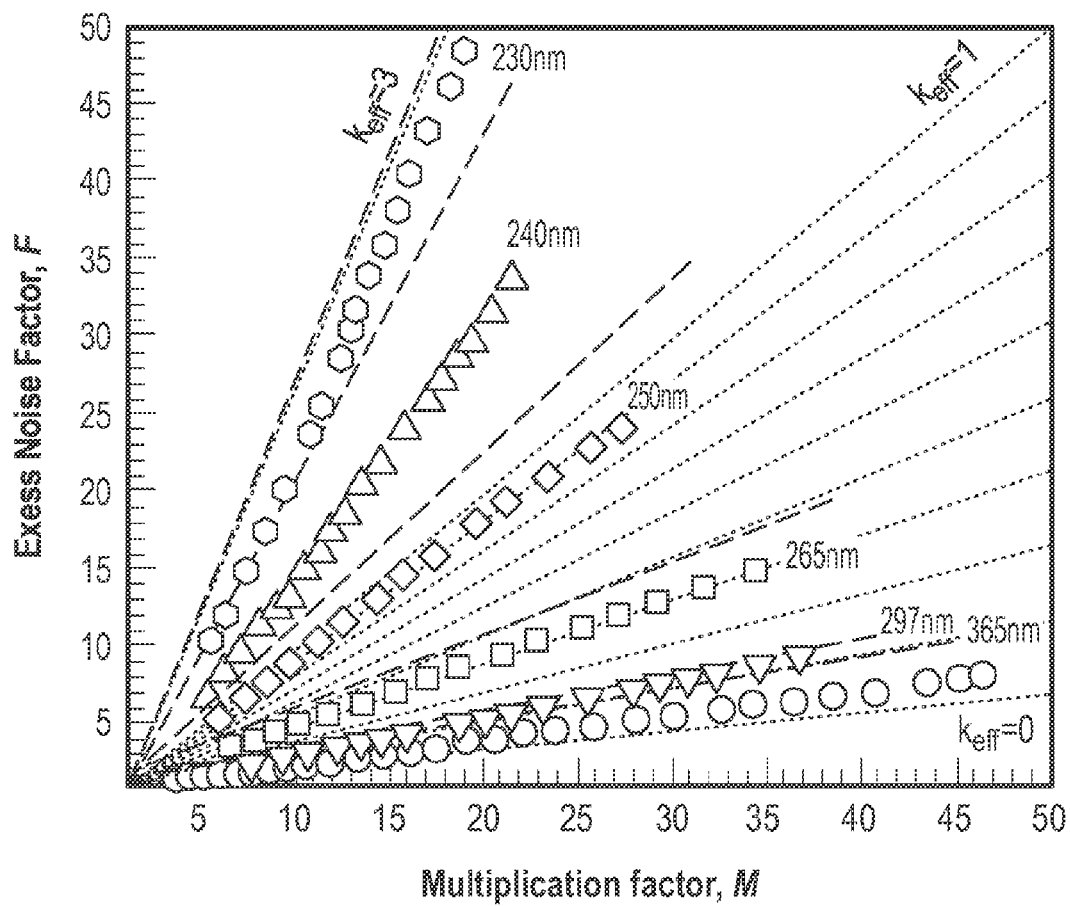
FIG. 10 is a graph showing measured (symbols) and modeled (dashed lines) excess noise characteristics of a structure similar to the one shown in FIG. 8 (photon impinging on p-doped layers) from 230 to 365 nm. Dotted lines correspond to McIntyre's local prediction for $k_{eff}=0$ to 1 in steps of 0.1 and $k_{eff}=2$ and 3.

It is evident from the graphs of FIGS. 10, 7(a), and from SiC physical properties that to minimize excess noise in ultraviolet SiC APD operation, pure hole-initiated impact ionization must occur. In the disclosed APD of FIG. 11, the photon 22 is incident and fully absorbed in a low doped n− doped layer 30. The APD layer dopings and thicknesses are such that a low electric field is present in the n− doped absorption layer 30, while a high electric field is present in the n+ doped multiplication region 32. The absorbed photon 22 in the n− region 30 can create an electron and a hole which move in opposite directions under the influence of the low electric field. The electric field is low enough to prevent electron initiated impact ionization from occurring in the n− absorption layer 30. The electron will be moved by the field to the n metal contact 34, while the hole will be moved toward the n+ high electric field where avalanche multiplication will be initiated. The depletion region of the APD at reverse bias is sufficiently wide (at a specific wavelength range) to prevent holes from recombining prior to entering the high electric field avalanche multiplication region.

For lower excess noise at a specific wavelength range, the APD layer thicknesses and dopings should ensure that photons are entirely absorbed in the thick n− doped region 30, photo-generated electrons are moved to the n− contacts 34 without undergoing avalanche multiplication, and that only photo-generated holes are injected in the high-field n+ multiplication region 32. As one knowledgeable in the field will recognize, this can be easily achieved by basic textbook electromagnetic field calculations that will point to the APD layer thicknesses and dopings for the specific ultraviolet range of interest. For example, as the wavelength decreases the UV light is progressively absorbed at shorter depths and so the n− layer 30 can be made thinner. As the wavelength increases, the UV light is progressively absorbed at longer depths and so the n− layer 30 can be made thicker to ensure that photons are entirely absorbed in the n− layer 30 and thus only holes are injected in the multiplication region 32. The other APD layers are adjusted accordingly in thickness and doping for low excess noise APD operation.

As an example, a back-illuminated APD structure that achieves the above goals in the approximately 280 nm ultraviolet wavelength range is shown in FIG. 11. The backside substrate/buffer etch to open the window section or segment 72 for photon detection can be done by standard inductive-coupled-plasma (ICP) or reactive-ion-etching (RIE) techniques. ICP is preferable as the etch proceeds at a faster rate. In one embodiment of the present invention, the substrate is thinned to facilitate etching to the n− lightly doped layer 30.

The present APD invention differs from the prior art in at least the following ways:

The photon is incident on the n− layer 30 which is necessary for minimum excess noise operation while the APD layers are grown with low defect density over n+ doped SiC substrates. Epitaxy of APD layers over the commercially available low-defect n+ doped SiC substrates (as opposed to prior art "higher defect" APD layer epitaxy over a thick p+ layer superimposed over a low-defect n+ doped SiC substrate in order to achieve n− layer photon incidence for low excess noise) results in low defect high quality epitaxial layer growth. Lower defect traps and the resultant lower dark current in APDs of the present invention enable operation in Geiger mode with minimal dark count rate (false detections).

Placing the n metal contacts in the thick n+ doped SiC substrate (as opposed to lateral contacts over a relatively thin p+ layer of prior art) reduces resistance R. This reduces the overall APD RC constant, which increases bandwidth. It also reduces the recovery time for passive quenching and the gate-length for gated passive quenching in Geiger mode operation. These reductions minimize dark counts (false detections) in Geiger mode operation.

In addition to ensuring pure hole injection and amplification for low excess noise, and high quality material fabrication for low dark current, this invention discloses a combination of angled or sloped sidewall 40 and guard rings 26 to ensure:

Low leakage current

Figure 4:
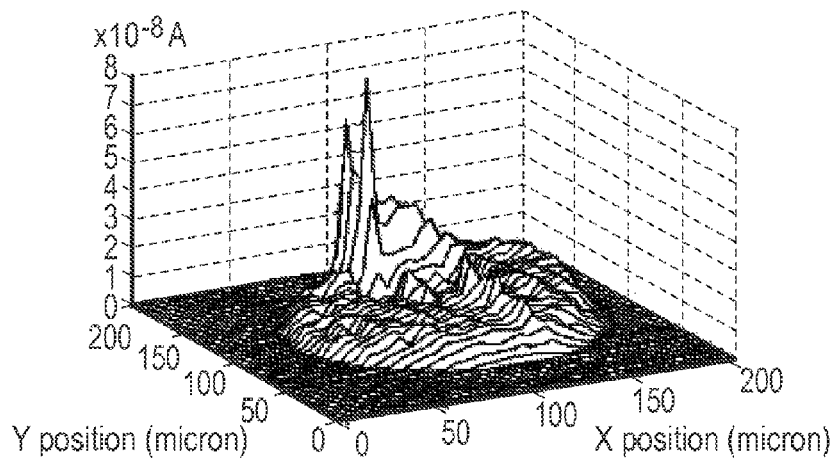

Elimination of premature breakdown at the edges of the device. This allows for more uniform APD breakdown as the breakdown is determined by the designed APD SiC epitaxial layers and not the premature edge breakdown which varies among APDs of the same design. The presence of the guard rings also makes it possible to bias the APD at the very high gains needed for Geiger mode operation, without the premature edge breakdown seen in FIG. 4 at a gain of 1000 for example.

Figure 5:
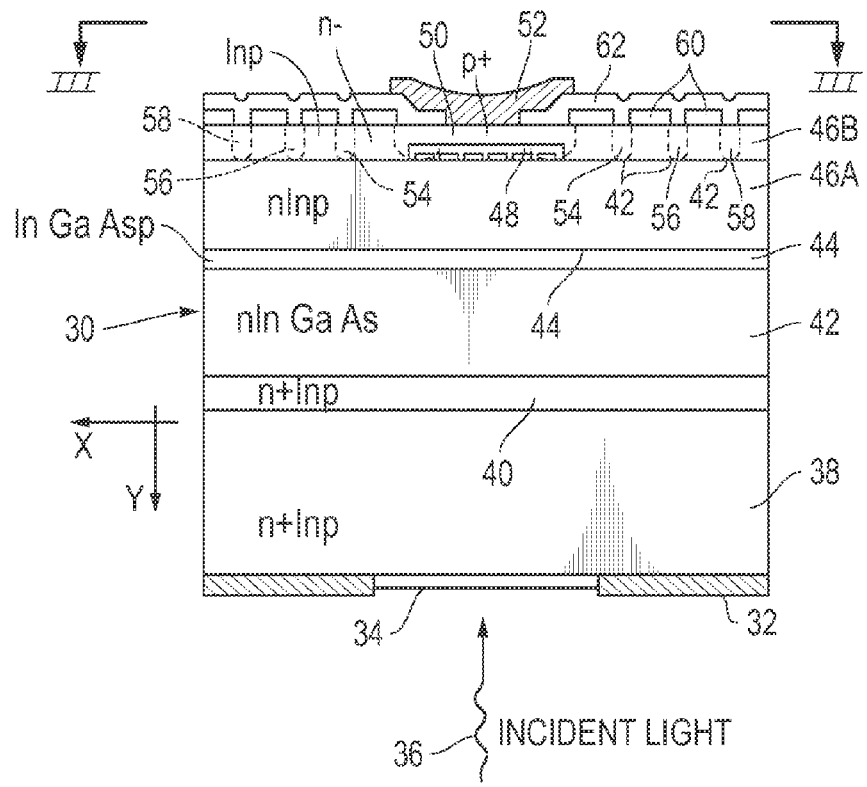
FIG. 5 is a cross-sectional view of a prior art InP/InGaAs APD with a plurality of planar floating guard rings.
Figure 6:
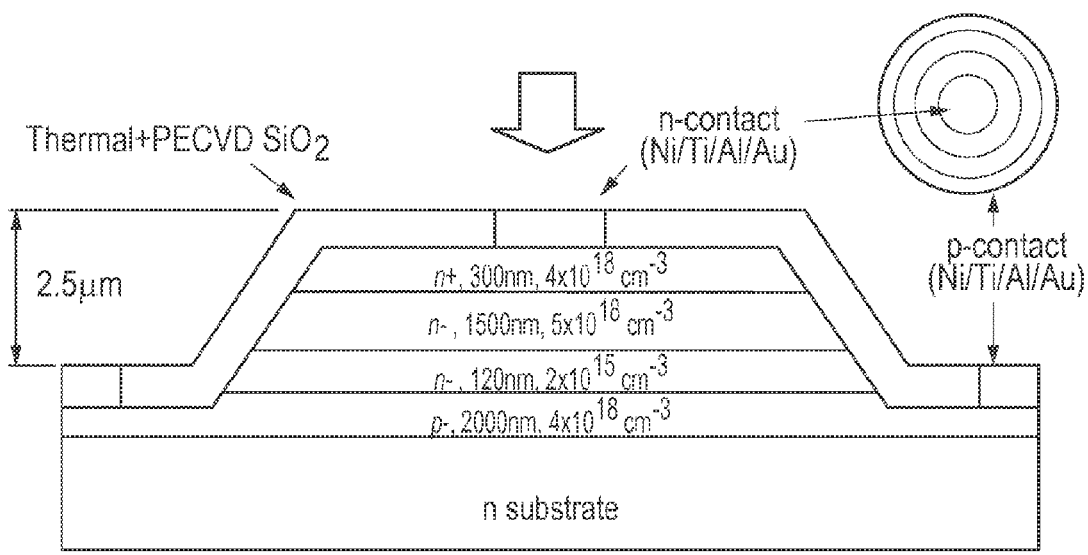
FIG. 6 is a cross-sectional view showing a prior art structure for low excess noise with n-doped layers grown over a 2 μm thick p-doped layer. The lateral contacts on the p-doped material are also shown.

Unlike the planar floating guard rings 42 of prior art FIG. 5, non-planar rings 26 combined with an etched MESA 54 are used in the APD 20 of the present invention, which non-planar rings 26 are more effective at eliminating premature edge breakdown that is due to electric field crowding. The non-planar rings 26 are below or beneath the plane formed by the p+ doped material layer 24 on the upper side 78 of the device. By positioning the rings 26 deeper in the n− layer 30, one improves on the edge termination performance of the APD 20.

Edge termination is improved by etching a known MESA type sidewall 40 having an upper surface 41 and bottom of sloped MESA moat surface 43, and forming a plurality of floating guard rings 26 at the bottom 43 of the etched MESA type APD device. This creates a non-planar guard ring 26 structure the effectiveness of which has been proven by measuring the reverse breakdown of SiC diodes. The MESA type sidewall 40 can be vertical or angled. It is well known that an angled or sloped sidewall MESA APD has lower dark current than a vertical sidewall MESA APD of otherwise identical design.

Figure 12:
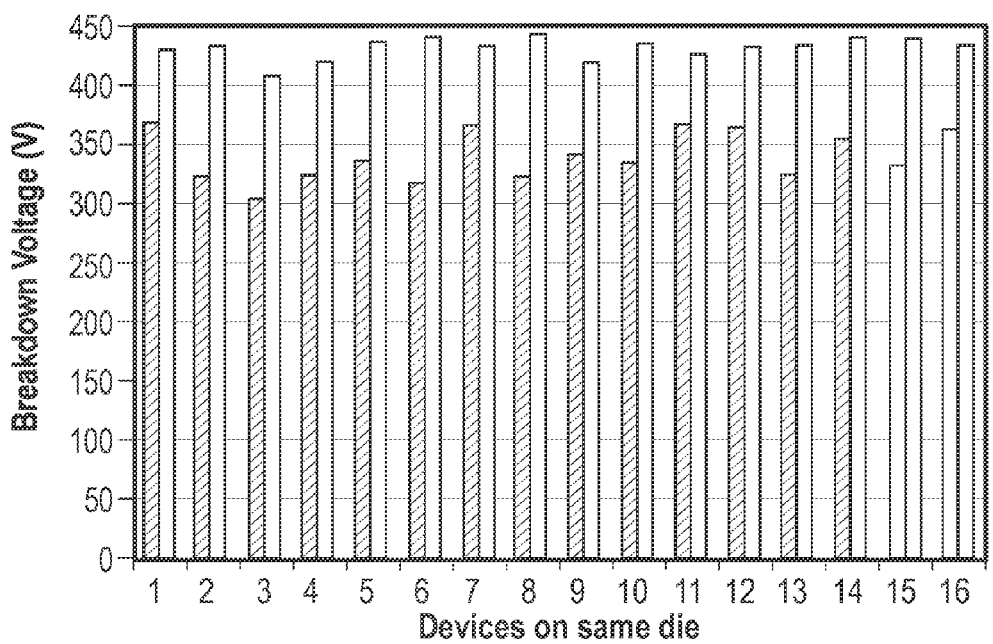
FIG. 12 is a graph showing the breakdown voltage of power diodes with no floating guard ring edge terminations. All diodes were fabricated on the same wafer.
Figure 13:
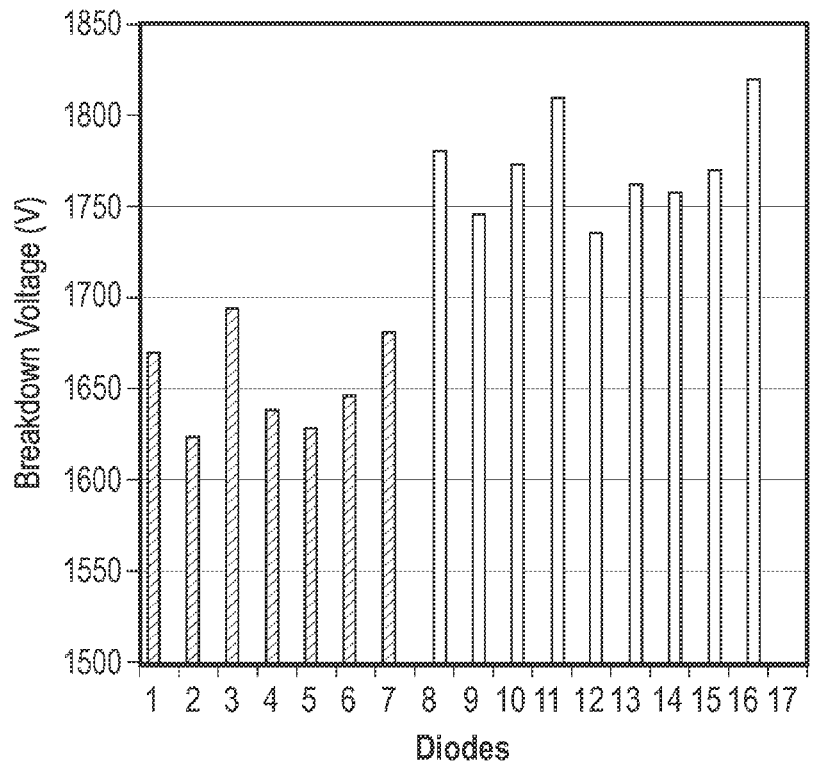
FIG. 13 is a graph showing breakdown voltages of diodes with a plurality of floating guard rings. The diodes shown in bars 8 through 16 toward the right in the graph (average breakdown of 1773 V) had sidewalls etched deeper to a lightly doped n layer and a plurality of floating guard rings formed in that layer. The diodes toward the left, bars 1 through 7, (average breakdown of 1654 V) had sidewalls etched shallower to a highly doped n layer and the same plurality of floating guard rings formed there.

The effect of the depth 44 of the etched sidewall 40 on edge breakdown performance is shown in FIG. 12. In general, the present avalanche photodiode device 20 has a voltage breakdown that is fixed by the thickness and dopings of the vertical stack of constituent layers. The diodes shown as the higher bar in each pair of bars shown in the graph (average breakdown of 432 V) had sidewalls etched deeper to a lightly doped n layer. The shorter bar in each pair of bars in FIG. 12 depict diodes (average breakdown of 342 V) that had sidewalls etched shallower to a heavily doped n layer.

As shown in FIG. 12, diodes with a deeper sidewall etch to the lightly doped n− layer 30 have an average 27% higher breakdown voltage than diodes with a shallower sidewall etch to the higher doped n+ layer 32, which is situated on top of the lightly doped n− layer 30. To take advantage of the improvement in edge termination described above, the present APD device has a sidewall etch that fully etches past the highly doped n+ layer 32, and stops in the lightly doped n− layer 30. The sidewall etch can be performed using standard angled sidewall formation etch techniques. F. Van, C. Qin, J. H. Zhao, and M. Weiner, "Novel technology for the formation of a very small bevel angle for edge termination," in *Mater. Sci. Forum*, vol. 389-393, 2002, pp. 1305-1308. Determination of depth of etch can be done by performing metrology measurements in combination with electrical probing measurements. As the n doped layers 30 and 32 have an approximately 1000 $cm^{-3}$ times difference in doping levels, their electrical characteristics differ which can be exploited to determine the point at which the etch has fully passed the n+ layer 32 and is now at the n− layer 30. The thickness of the n− layer 30 allows for reasonable overetch to ensure that all the devices within a wafer have been etched to their n− layer 30. This overetch safeguards against any anisotropy in the etching or non-uniformity in the thickness of the epitaxial layers 30, 32, and 24.

After the completion of the sidewall etch, a plurality of floating guard rings 26 can be formed in the n− layer 30. Alternatively, the sidewall etch can be shallower and terminate in the heavily doped n+ layer 32, with a plurality of floating guard rings 26 formed partially or in their entirety in layer 32. The breakdown voltage of the APDs will be lower in this case compared to a deeper sidewall etch and formation of floating guard rings 26 entirely in the lightly doped n− layer 30. Maximizing edge termination capability is desirable in Geiger mode low photon intensity detection applications as it allows for maximizing gain without the occurrence of non-uniform breakdown. Applications with lower gain or higher photon intensity detection requirements can make use of APDs with a shallower etch, which might have the advantage of simpler semiconductor processing.

Based on the sidewall etch and non-planar floating guard ring edge termination advantages presented above; an APD fabrication sequence is outlined below. As one knowledgeable in the field will recognize, the same structure can be fabricated in several ways by modifying standard processing steps described below without deviating from the scope of this invention.

Figure 14:
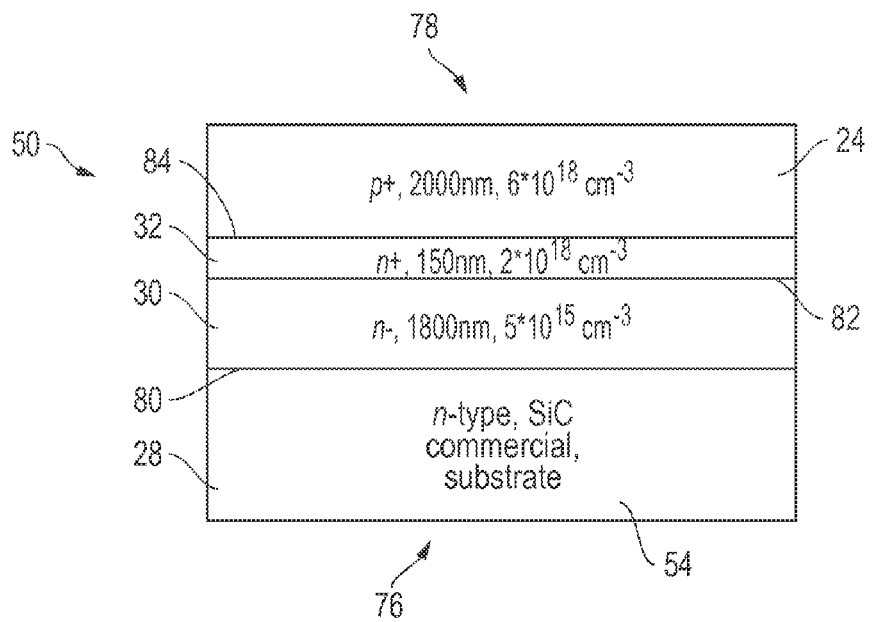
FIG. 14 is a cross-sectional view of an n-type SiC substrate with desired epitaxial layers for low excess noise APD operation at approximately 280 nm.

1. Obtain wafer 50 (see FIG. 14) with epitaxial layers or slabs grown over base n+ doped SiC substrate 52. As stated previously, the SiC substrate 52 can have an approximately 1 μm thick n+ buffer layer on its top side, which facilitates with growth of subsequent epitaxial layers. Standard techniques can be used to form the desired epitaxy over a SiC substrate 52. As described above, the layer thicknesses and doping levels at a specific UV wavelength range of operation should allow for pure hole injection and multiplication to minimize excess noise in SiC APDs. Depending on the desired wavelength of UV detection, layer thicknesses and doping levels can be determined by standard electromagnetic calculations. The thickness, dopings and number of layers in FIG. 14 are for an APD operating at about 280 nm with minimal excess noise.

The n− layer 30 is sandwiched between the n+ SiC substrate slab 52 and the n+ doped layer 32. The SiC substrate layer 52 and the n− layer 30 share a common interface or surface 80. The n− slab 30 and the n+ layer 32 share a common interface or surface 82. Similarly, the n+ layer 32 is sandwiched between the n− layer 30 and the p+ doped layer 24. The n+ block 32 and the p+ slab 24 share a common interface or surface 84.

Figure 15:
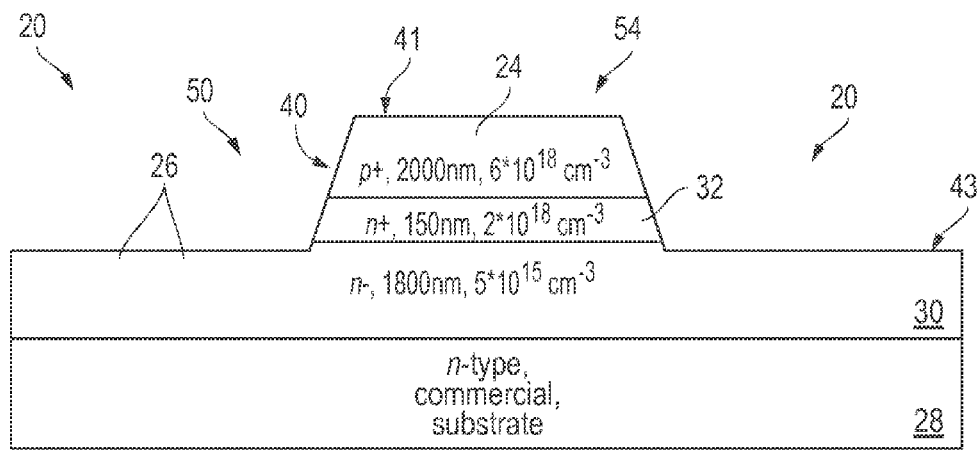
FIG. 15 is a cross-sectional view of an APD of the present invention at completion of the sloped sidewall etch step.

2. RIE, ICP or other standard etching methods are used to create a MESA configuration having an angled or sloped sidewall 40 (see FIG. 15). Resist reflow with temperature is one of the methods used to create an angled sidewall. By controlling the temperature and bake time, one can adjust the resist retlow and consequently the angle of the sloped MESA 54. For maximum breakdown voltage performance as described above, the sloped sidewall 40 etch should go through the p+ and n+ layers 24 and 32, respectively, and terminate in the n− layer 30 of FIG. 15. Standard metrology equipment (like a profilometer) can be used to measure etch depth. As the n doped layers 30 and 32 have an approximately 1000 $cm^{-3}$ times difference in doping levels, their electrical characteristics differ, which can be exploited to determine the point at which the etch has fully passed the n+ layer 32 and is now at the n− layer 30. Electrical probing measurements using a curve tracer or similar equipment can verify that etching has terminated at the n− lightly doped layer (light doping electrical signature).

Alternatively, to simplify processing, a shallower etch can be made (an etch that terminates in the highly doped n+ layer 32) for applications that do not require very high APD gain.

3. Thermal passivation of the sidewall 40 surfaces minimizes dark current. This can be achieved in a number of ways including growing an initial oxide layer by wet or dry thermal oxidations 58 (see FIG. 16). Subsequently, dielectric layers 60 can be deposited by chemical vapor deposition or other suitable dielectric deposition techniques to cap the thermal oxide, FIG. 16. Examples of dielectric layers include silicon dioxide ($SiO_2$), phosphosilicate glass (PSG), borophosphosilicate glass (BPSG), silicon nitride, and silicon oxynitrides. Dielectrics can be reflowed at high temperature to planarize surfaces and to facilitate the step coverage of subsequent layers. PSG reflows at >1000° C. while BPSG reflows at 700° C. PSG is a diffusion barrier to moisture while both PSG and BPSG getter alkali ions. Silicon nitride is a nearly impervious barrier to diffusion; in particular moisture and sodium find it very difficult to diffuse through the nitride film. "Silicon Processing for the VLSI ERA, Volume 1—Process Technology" S. Wolf and R. N. Tauber, Lattice Press 1986. By depositing a sequence of dielectric layers 60 on top of the high quality thermally grown oxide 58 the APD is passivated, becomes capable of operating reliably over long periods of time, can operate reliably at the high temperatures exceeding 300° C., and becomes capable of reliably operating in "radiation hard" environments such as those encountered in space. For example, a thermally grown oxide layer 58 can be superimposed by a dielectric deposition sequence 60 consisting of 50-200 nm silicon nitride, superimposed by 200-1000 nm of PSG, which is superimposed by another 50-200 nm silicon nitride layer. This sequence allows the APD to operate at up to 1000° C., and in radiation harsh environments as it possesses excellent resistance to moisture and sodium, and effectively getters alkali ions. Depending on the specifics of the operational environment, a suitable sequence of dielectric layers 60 is deposited.

Figure 16:
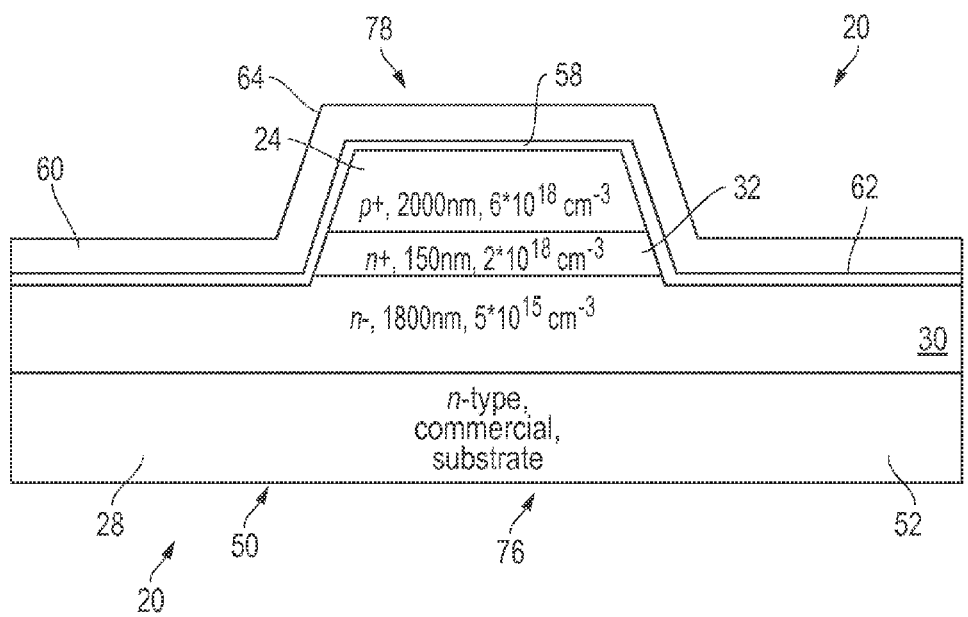
FIG. 16 is a cross-sectional view of an APD of the present invention at completion of passivation.

In FIG. 16, an inner line 62 denotes the borders of the thermally grown oxide layer 58. The outer line 64 denotes the border of the dielectric layers 60, which are deposited on top of and cap the thermal oxide layer 58.

Figure 17:
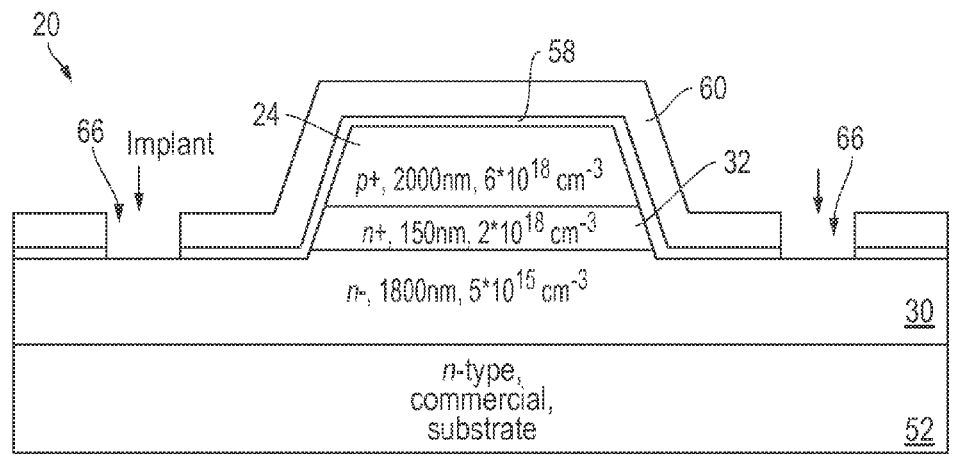
FIG. 17 is a cross-sectional view of an APD of the present invention at a stage of selective etch of oxide and dielectrics, using standard lithography techniques, exposing the SiC epitaxial surface by opening windows in the oxide and dielectric layers for p implantation. The oxide and dielectrics that are present elsewhere during implantation protect the APD from getting implanted in non-desirable areas.

4. Using standard lithography, windows 66 are opened in the oxide and dielectric layers 58 and 60, respectively, (to expose the underlying SiC epitaxial layer 30) over the SiC locations to be p implanted in order to form the floating guard ring 26 structure. See, FIG. 17. Aluminum and boron are among the ions that can be used for p implantation of n material to form the guard rings 26. The oxide and dielectrics present elsewhere on the APD surface during this implantation process protect the APD 20 from getting implanted in non-desirable areas.

By adjusting the number, thickness and spacings of the plurality of non planar guard rings 26 or the sets of non planar guard rings 26 and the dose and energy of the implantation, the edge termination breakdown is made virtually equal to that of the SiC semiconductor material limit (determined by the thicknesses and dopings of the epitaxial layers). As all APDs fabricated as outlined in this disclosure have voltage breakdowns determined by the thicknesses and dopings of the SiC epitaxial layers (common to all APDs of identical design), voltage uniformity can be achieved. In addition to voltage breakdown uniformity, the edge leakage current will be minimized, which reduces the overall APD dark current.

Figure 18:
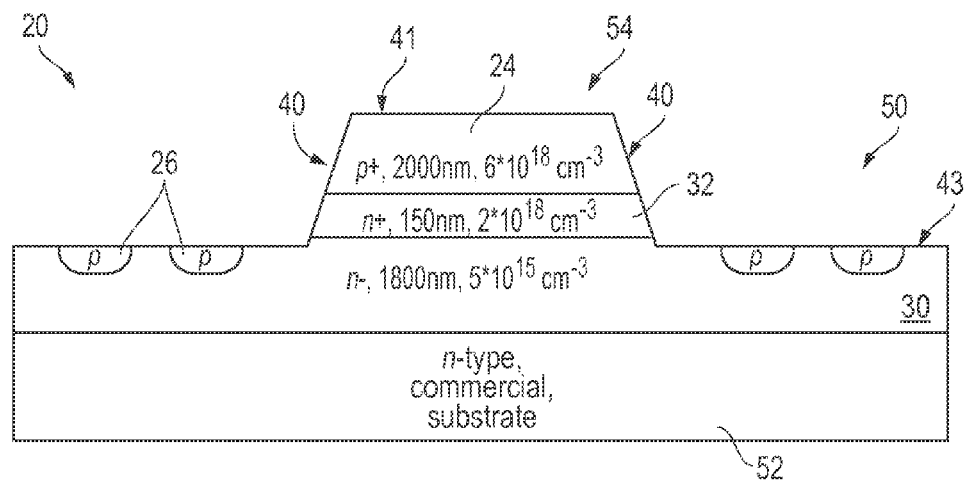
FIG. 18 is a cross-sectional view of an APD of the present invention after completion of p dopant implantation and thermal activation of the dopants.

After the ion implantation has completed, the remaining oxide and dielectric layers 58 and 60, respectively, are removed by standard wet etch techniques. Subsequently, the wafer 50 is heated at high temperature for dopant ion activation and crystal damage thermal-annealing. The device 20 looks as in FIG. 18 at this point. The floating guard rings 26 are shown in cross-section in FIG. 18 with a "p" marking denoting their p-type doping. A single or a plurality of floating guard rings 26 can be formed by patterning windows 66 in the oxide and dielectric layers 58 and 60, respectively, and implanting as mentioned.

Figure 19:
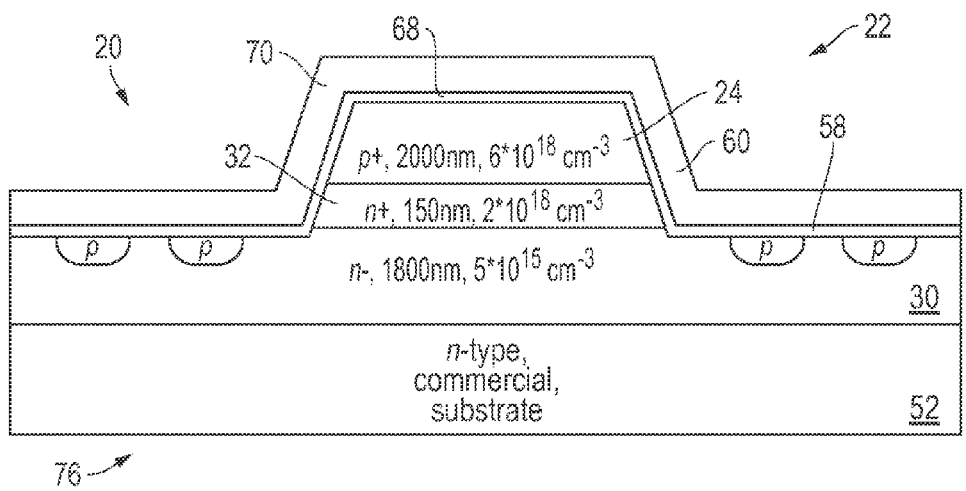
FIG. 19 is a cross-sectional view of an APD of the present invention after the growth of high quality thermal oxide layer and deposition of dielectric layers for minimal dark current, enhanced reliability, and radiation hardened operational capability.

5. Thermal passivation of the sidewall surfaces 40, top surface 41, and bottom of the sloped MESA moat surface 43, takes place to minimize dark current. An initial high quality thermal oxide layer 68 is grown by a combination of wet and dry thermal oxidations. This layer 68 can act as a sacrificial layer that is removed by a wet etch process and a new layer of thermal oxide 68 is grown in its place to minimize dark current. Alternatively, the initial thermal oxide layer 68 is not a sacrificial layer and as such is not removed. Subsequently, dielectric layers 70 are deposited by chemical vapor deposition or other suitable deposition techniques on top of and to cap the thermal oxide layer 68, FIG. 19. At this stage, the device 20 looks as in FIG. 19.

6. An appropriate backside mask is created by standard lithographic techniques and a substrate-etch is done with standard RIE, ICP, or other dry or wet etching techniques. With the aid of the mask, this etch preferentially removes a portion 72 of the heavily n+ doped substrate layer 52 from the center of the "underside" of the device 20 and stops at the lightly n– doped 1800 nm layer 30. The area 72 where the substrate 52 has been removed is the photon detection area of the APD 20, i.e., the "lower" or underside exposed surface portion 74 where an impinging photon 22 can be detected. Etching of the backside 72 roughens the photon incidence surface 74, which acts as an antireflection surface by increasing light-trapping for higher external quantum efficiency. The 1800 nm epitaxial layer 30 has an n doping level that is 3 to 4 orders of magnitude lower than that of the substrate 52. As a result, the electrical characteristics of the n+ substrate 52 and the 1800 nm lightly n– doped layer 30 are very different. Thus, electrical probing can indisputably reveal if the probed surface is n+ substrate 52 or n– epitaxial layer 30. By performing a combination of semiconductor metrology and electrical probings, the backside etch can stop at the point where the lightly n-doped layer 30 is exposed (substrate totally removed).

Figure 20:
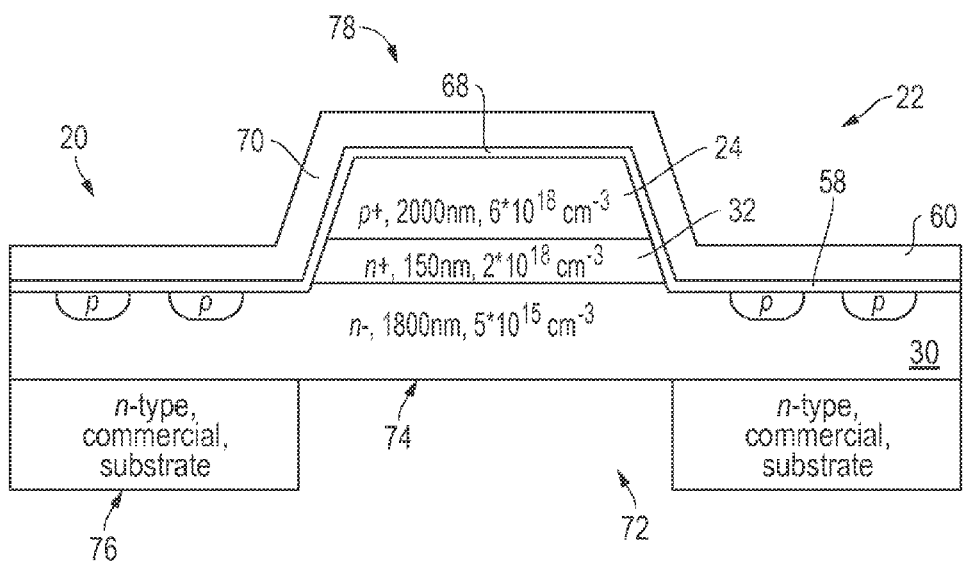
FIG. 20 is a cross-sectional view of an APD of the present invention at completion of backside etch. The APD is operated by back illumination.

In another embodiment, to aid with the back etch, the n+ SiC substrate 52 can be thinned in its entirety by use of standard etching techniques, prior to the "mask assisted" preferential substrate etch. At this stage, the device looks as in FIG. 20.

7. The final step involves the creation of ohmic or conductive contacts 36 and 34 on the top-side p+ doped layer and on the bottom n+ doped substrate, respectively. A window (not shown) is opened in the oxide and dielectric layers 68 and 70, respectively, of the front side 78 (to expose the underlying p+ doped SiC layer 24) and a metal layer stack is deposited to form a low resistance Ohmic or conductive metal contact. Patterning of metal is also done on the backside 76. Prior to backside metallization, a backside oxide etch is performed on the backside metal contact designated areas to remove any oxide layers created during the thermal oxidation processing steps. A thin layer (50-100 nm) of Nickel (Ni) and/or Titanium is deposited and patterned by metal lift-off or etching using standard lithographic techniques. In another embodiment, a Titanium (Ti) layer or Titanium tungsten (TiW) layer or Titanium Nitride (TiN) layer or any combination of these layers is deposited to Cap the Ni. At completion of the Ni or Ni/Ti or Ni/TiW or Ni/TiN metallization, the device 20 is subjected to a high temperature rapid thermal annealing or other thermal treatment to create Ni or Ni/Ti silicide. SiC is a wide band gap semiconductor with a melting point of 2830° C. and excellent thermal conductivity. For UV SiC APD operation at temperatures as high as 1000° C., contacts capable of withstanding high temperatures are needed. Standard Aluminum (Al) based metal contacts limit high temperature operation to below the 660° C. melting point of Al. Furthermore, the thermal expansion coefficient disparities between SiC ($4.5 \times 10^{-6}$/° C.), and Al ($23.1 \times 10^{-6}$/° C.) and gold ($14.2 \times 10^{-6}$/° C.) metals limit the high-temperature long term reliability of SiC APDs with Aluminum or gold based contacts. This is because as the SiC APD is heated, the aluminum and gold films adhered to the more massive underlying SiC substrate and epitaxy want to expand more than is allowed by the lower SiC expansion. As a result, at high temperature APD operation, aluminum or gold based contacts experience compressive stress that creates spike-like projections that erupt, can damage the passivation oxide and dielectric layers, and can tear from the underlying connection to the SiC material creating very resistive connections and in more extreme cases open circuits.

Use of refractory metals like Tungsten (W) and Molybdenum (Mo) for the formation of SiC APD contacts allow for metallizations that can reliably operate at temperatures in excess of 1000° C. This is because the expansion coefficients of $4.5 \times 10^{-6}$/° C. for tungsten and $4.8 \times 10^{-6}$/° C. for Molybdenum closely match the $4.5 \times 10^{-6}$/° C. of SiC. In addition the melting points of 3382° C. for tungsten and 2620° C. for Molybdenum do not limit the high temperature operation of SiC which has a melting point of 2830/° C. In general, a preferred embodiment of the conductive metal contacts would use a material having a coefficient of thermal expansion that is within 20% (approximately) of the coefficient of thermal expansion of the avalanche photodiode's base n+ layer 52.

Formation of tungsten and Molybdenum metal contacts in SiC relates to an earlier filed application entitled "SYSTEMS AND METHODS FOR INTERCONNECT METALLIZATION USING A STOP-ETCH LAYER", Ser. No. 11/584,990, filed Oct. 23, 2006, assigned to the assignee of the present disclosure, the disclosure of which is incorporated herein as if fully set forth. For example, in one embodiment of the present invention, Ti/TiW/W/TiW metal contacts can be formed. In another embodiment a molybdenum based contact is formed.

Figure 21:
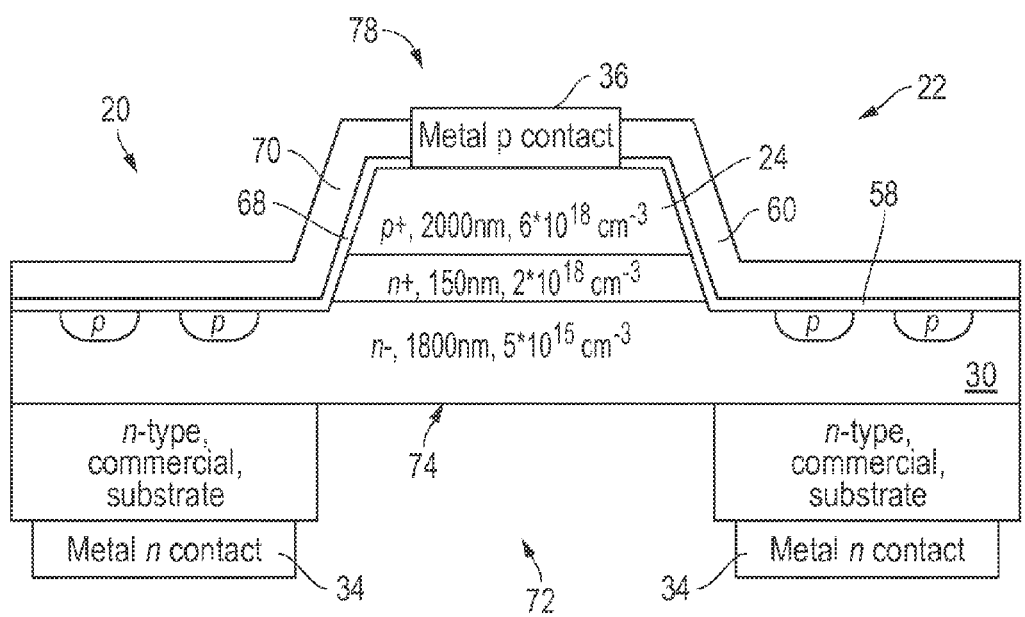
FIG. 21 is a cross-sectional view of a planar guard ring edge termination APD of the present invention at the completion of fabrication.

The APD 20 at completion of contact metallization is shown in FIG. 21.

The detection surface to receive the impinging photon 22 is the backside 76 of the semiconductor device 20.

By way of example the following guard ring 26 widths and spacings may be utilized:

Position of first ring from edge of MESA: 1.5, 2, and 2.5 µm

Width of rings: all rings 2 µm, all rings 3 µm, or all rings 4 µm

Ring spacings design 1: mesa to first ring as above, 1.5, 2, 2, 2.5, 2.5, 3.0, 3.0, 3.5, 3.5

Ring spacings design 2: mesa to first ring as above, 1.5, 1.5, 2, 2, 2, 2.5, 2.5, 2.5, 3.0, 3.0, 3.0

In another embodiment, an antireflection coating or crystal 86 may be provided in the photon incidence window 72 to maximize external quantum efficiency of the semiconductor device 20.

In yet another embodiment, a solar wavelength absorption filter coating or crystal 86 may be provided in the photon incidence window 72 to maximize external quantum efficiency.

Figure 22:
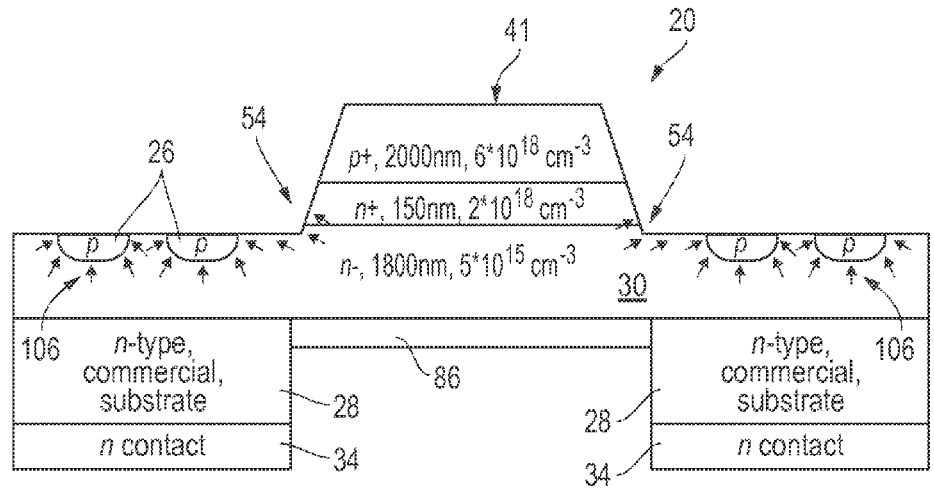
FIG. 22 is a cross-sectional view of a semiconductor device showing electric field crowding at the edges of the MESA being alleviated by the presence of the floating guard rings of the present invention.
Figure 23:
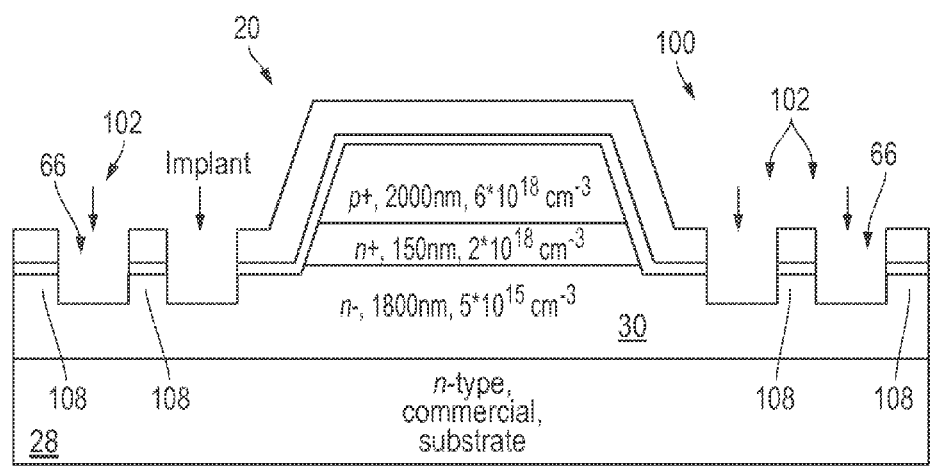
FIG. 23 is a cross-sectional view of a semiconductor device with a grating like structure etched inside the SiC layer.

In yet another embodiment, a non-planar guard ring grating 100 is formed in the SiC surface to further improve the edge breakdown capability that is crucial for high gain biasing needed to achieve Geiger mode operation. In FIG. 23, windows 66 are opened in the oxide and dielectrics (to expose the underlying SiC epitaxial layer) over the SiC locations to be p implanted in order to form the non-planar floating guard ring grating structure 100. The electric field 106 crowding at the edges of the MESA is alleviated by the plurality of floating guard rings 26 and is spread across the rings thereby increasing the edge voltage breakdown value to that of the vertical epitaxial structure. FIG. 22 shows the spreading of the electric field 106 among the multiple floating guard rings 26.

A non-planar guard ring grating structure 100 is formed by creating a grating or toothed pattern 102 into the SiC n– doped layer 30 prior to ion-implantation. The grating pattern 102 includes a portion or finger extension of SiC material that extends between the p guard rings 26 in a finger like fashion 108. For a sloped MESA etch that extends to the lightly doped n– layer 30, as is the etch schematically shown in FIG. 15 (the preferable embodiment etch depth for maximizing edge breakdown capability), the finger extension SiC material between the p guard rings is entirely within the lightly doped n– SiC layer 30. For a "shallower" sloped MESA etch that terminates in the n+ doped layer 32, the SiC finger extension material between the p guard rings is entirely within the heavily doped n+ SiC material or has its top portion made of n+ SiC material.

In another embodiment of the present invention, an APD with a grating guard ring edge termination structure and no MESA can be fabricated by etching grating guard rings directly in the structure of FIG. 14, with the etch going through the p+ doped layer 24 in its entirety and terminating in the n+ doped layer 32. In this embodiment, the SiC finger extension material between the p guard rings consists of n+ doped material 32 superimposed by p+ doped material 24. In yet another embodiment of the present invention, an APD with a grating guard ring edge termination structure and no MESA can be fabricated by etching grating guard rings directly in the structure of FIG. 14, with the etch going through the p+ doped layer 24 and n+ doped layer 32 in their entireties and ending in the n– lightly doped layer 30. In this embodiment, the SiC finger extension material between the p guard rings consists of an n– lightly doped material 30, superimposed by the n+ doped layer 32, which is superimposed by the p+ doped layer 24.

Fabrication of the grating structure 100 involves opening windows 66 in the oxide and dielectric layers 58 and 60, respectively, (to expose the underlying SiC epitaxial layer 30) over the SiC locations to be p dopant implanted. Standard lithography creates a mask and an etch removes the oxide and dielectrics only from the areas to be implanted (see FIG. 17), thereby exposing the underlying SiC material. In one embodiment, the oxide and dielectrics that have not been etched (present over the APD areas that do not get implanted) are used as a dielectric mask to facilitate with the etch of the exposed SiC for grating formation. An etching program that has a good etch selectivity between SIC and the oxide and dielectrics can be used. SIC is etched at a faster rate than the oxide and dielectrics that are used as an etch mask. For example, chlorine based reactive ion etching can selectively etch SiC at a much faster rate than it etches the oxide/dielectric mask used to protect areas that are not to be implanted. In another embodiment, a resist mask is used to facilitate with the etch of the exposed SIC for grating formation. The resultant device 20, which has a non-planar grating 102 formed in the n– doped layer 30 is shown in FIG. 23. In another embodiment of the present invention, the non-planar grating 102 is formed partially or in its entirety in the n+ doped layer 32.

Figure 24:
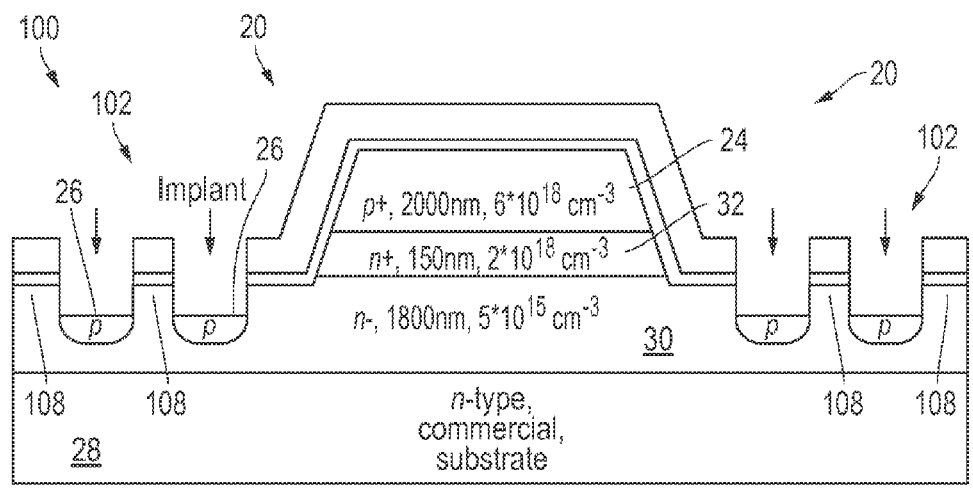
FIG. 24 is a cross-sectional view of a semiconductor device with a grating guard ring structure of the present invention.

Implantation of device 20 creates a non-planar guard ring grating structure 100 in the n– doped layer 30. The oxide/dielectric mask protects the areas that it covers from implantation. At completion of implantation, the device 20 is shown in FIG. 24. In this embodiment, a plurality of non-planar grating guard rings has been formed in the n– doped layer 30. In another embodiment of the present invention, a plurality of non-planar grating guard rings is formed partially or in its entirety in the n+ doped layer 32. The grating etched guard ring structure 100 spreads the electric field 106 effectively and therefore premature edge breakdown is eliminated. The grating etched guard ring structures 100 also minimize dark current, which is crucial for achieving Geiger mode APD operation.

Although p guard rings 26 have been implanted in n material, n grating guard rings can be formed in p material. Non-planar grating guard rings 100 alleviate field crowding and maximize breakdown voltage by eliminating premature breakdown at the edges of the MESA 54, FIG. 25. Although this non planar grating guard ring structure 100 is disclosed for SiC APDs, the concept of a plurality of non-planar grating guard rings 26 can be used in semiconductor photodiodes, diodes, and all vertical semiconductor devices that block voltage in any semiconductor material system.

The non-planar grating guard rings 26 (such as etched guard rings, or guard rings inside grooves as shown in figures) are not limited to the device as described, but are applicable to other semiconductor type devices where guard rings are used.

Figure 25:
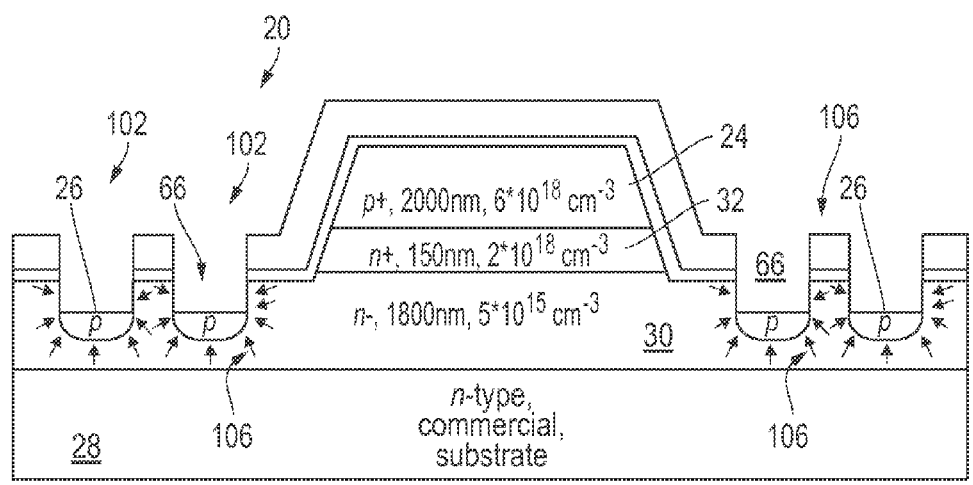
FIG. 25 is a cross-sectional view of a semiconductor device showing the effective spread of the electric field at the edges of the device through the use of a plurality of non-planar grating guard rings as is shown by the black arrows.

FIG. 25 shows the effective electric field 106 spread through the use of a plurality of non-planar grating guard rings 26. The spread of the electric field 106 avoids premature edge breakdown.

Figure 26:
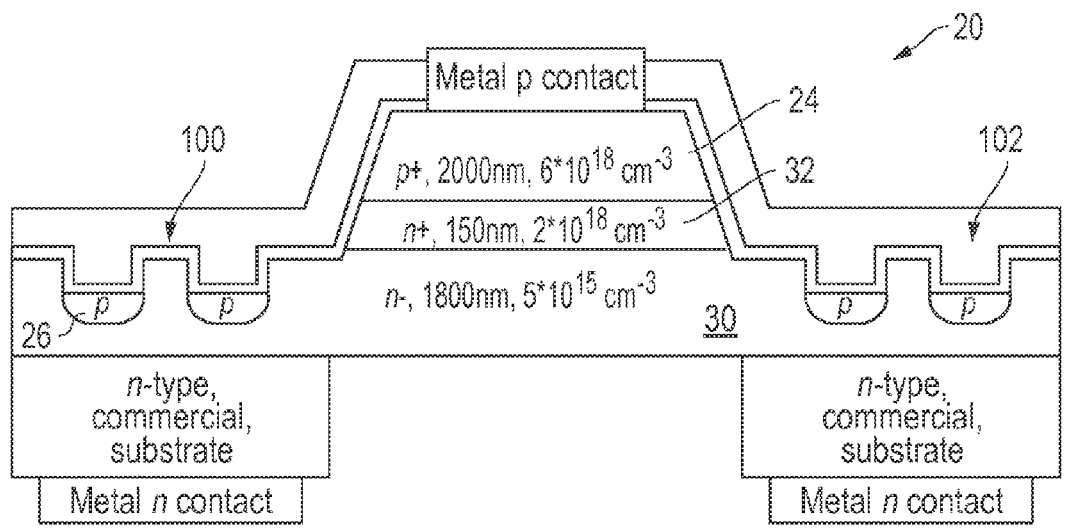
FIG. 26 is a cross-sectional view of a non-planar grating guard ring edge termination APD of the present invention at the completion of fabrication.

At completion of implantation for the formation of the non planar grating etched guard ring structure 106, the APD follows the fabrication processes (including those for the formation of passivation dielectrics and high-temperature operating metal contacts) outlined for the non planar guard ring structure APD in FIGS. 18, 19, 20 and 21. An APD with a non planar grating etched guard ring structure at completion of substrate etch and contact metallization formation is shown in FIG. 26.

SiC APDs fabricated as disclosed in this invention have uniform breakdown voltages as a result of the effective edge termination effected at least partly through the non-planar-guard-ring or the non-planar-grating-guard-ring edge terminations. As a result, APDs of the disclosed design can be incorporated in APD array configurations with simplified biasing circuitry for Geiger mode operation. As outlined in this disclosure, should Geiger mode APDs with disparate breakdown voltages be included in the same array, the applied voltage pulse value that biases the APDs beyond breakdown, will need to surpass the highest breakdown voltage value of the individual APDs that constitute the array. This can dramatically increase the dark-count-rate (number of false detections) as numerous APDs will be pulsed well above their breakdown voltages. To overcome this problem of elevated dark-count-rate in Geiger mode APD arrays, circuitry is implemented to individually bias each APD slightly above its breakdown voltage. This increases APD array complexity and cost. By incorporating the SiC APDs of the present invention in arrays operated in Geiger mode, a simplified biasing circuit can be used as all APDs can be biased to the same reverse voltage 204 (see FIG. 27) value with no penalty in the form of elevated dark counts. Consequently, complex circuitry that biases each APD individually is eliminated. The features of the UV SiC APDs outlined above may be integrated in the formation of an array for low UV light intensity or single UV photon detection and imaging.

Figure 27:
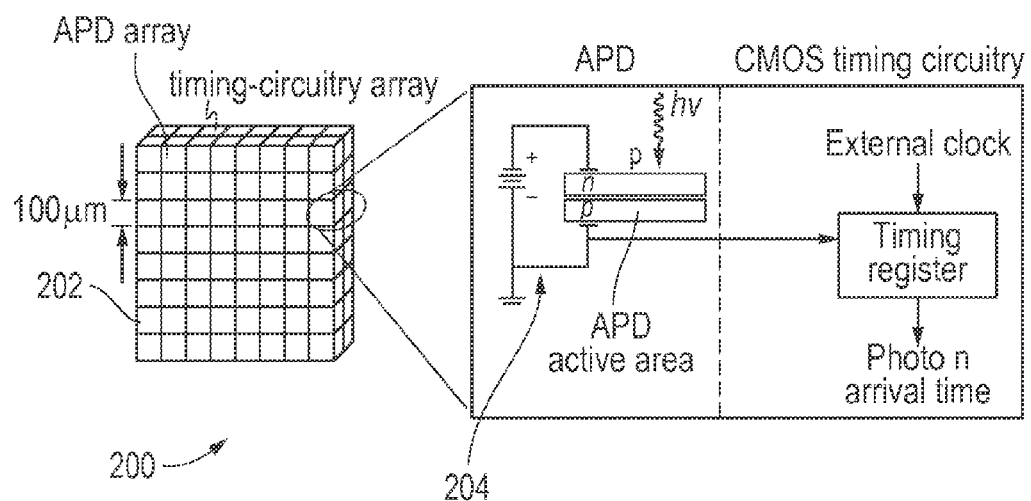
FIG. 27 is a top view of an exemplary eight by eight APD array configuration in accordance with an embodiment of the present invention.
Figure 28:
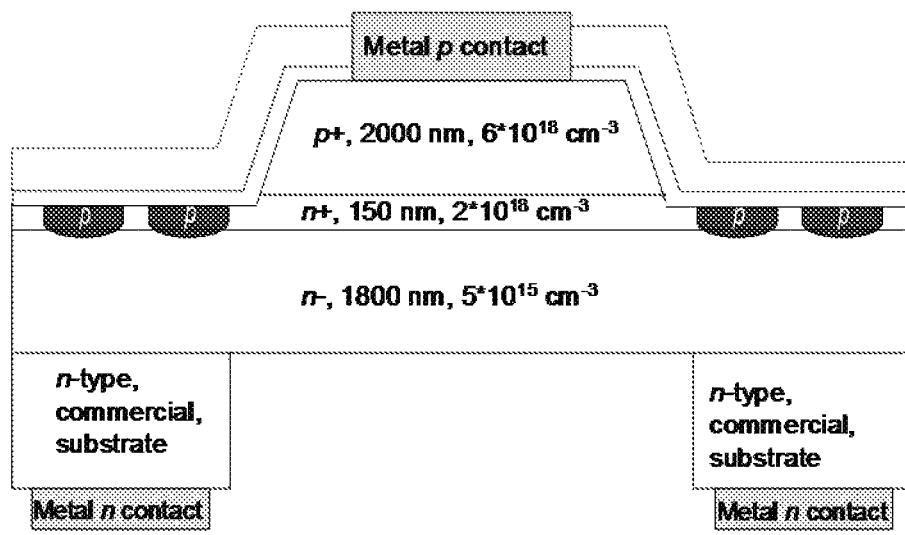
FIG. 28 is a cross-sectional view of a planar guard ring edge termination APD of the present invention at the completion of fabrication showing the guard rings being formed in a n+ layer comparable to the guard rings being formed in a n− layer shown in FIG. 21.
Figure 29:
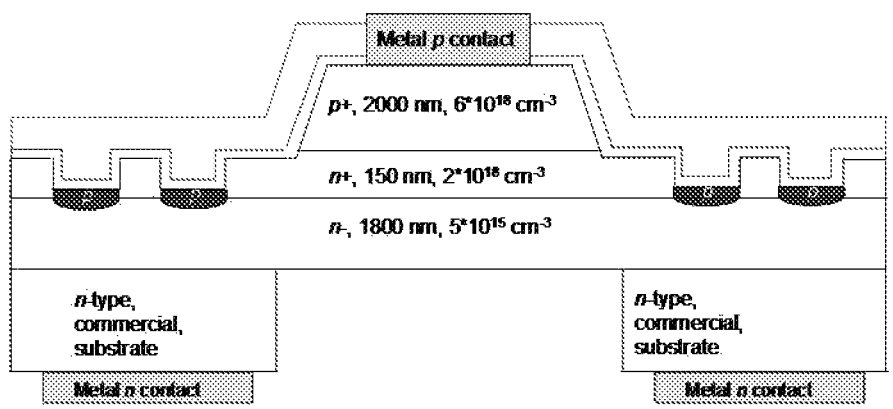
FIG. 29 is a cross-sectional view of a non-planar grating guard ring edge termination APD of the present invention at the completion of fabrication showing the guard rings being formed at least partially in a n+ layer comparable to the guard rings being formed in a n− layer shown in FIG. 26.

FIG. 27 is an example of an eight by eight APD array configuration 200 in accordance with an embodiment of the present invention. As APDs fabricated as described above have voltage breakdown uniformity, a single reverse voltage value can be used to bias all APDs of the array with no penalty in array dark count performance. While a 100 μm by 100 μm square APD configuration is shown, other shapes and configurations may be formed by the array of APDs in accordance with an embodiment of the present invention. At least two APDs 202 in accordance with an embodiment of the present invention can be used to form the APD array 200.

The SiC APDs 20 of this invention can operate at high temperatures and radiation hard environments due to the inherent properties of SiC, the outlined dielectric passivation, and the use of refractory metal contacts.

The SiC APDs 20 of the present invention can be Geiger mode biased at very high gains to detect very low UV intensity levels or single UV photons without suffering premature edge breakdown. The SiC APDs of the present invention can operate at extremely low dark currents as leakage currents are suppressed. The above are at least in part due to the disclosed non-planar-guard-ring or non-planar-grating-guard-ring edge terminations and the disclosed APD design that dictates growth of n– type epitaxial layers on n+ SiC substrates.

The SiC APDs 20 of the present invention can operate with exceptionally low excess noise as the disclosed design results in pure hole multiplication, which minimizes excess noise in SiC APDs.

The SiC APDs 20 of the present invention can operate with extremely low dark current and dark counts as the disclosed design for minimal excess noise is fabricated by well known high quality epitaxial growth on commercially available high-quality n+ SiC substrates. Epitaxial growth of n-layers on n+ SiC substrates minimizes incorporation of defects, which are responsible for undesirable dark current and dark count increases.

As a result of the innovations in the SiC APD 20 of the present invention, at least the number of applications below becomes possible:

Low UV intensity and single UV photon detection for UV non-light of sight communications, solar blind UV communications, cryptography, and laser induced UV fluorescence spectroscopy of single proteins, enzymes, and other macromolecules.

Low UV intensity and single UV photon detection of biological and chemical agents and of UV signals in environmental terrestrial and atmospheric applications.

Low UV intensity and single UV photon detection air and fluid purification, and sterilization applications.

Low UV intensity and single UV photon detection optical storage applications.

Radiation hard and high temperature low UV intensity and single UV photon detection applications including space, well-drilling, and engine flame monitoring applications.

The low excess noise, low dark current, and uniform voltage breakdown of the APDs of this invention enable low UV intensity and single UV photon imaging arrays with reduced APD biasing circuitry complexity: real time single protein, enzyme, and other macromolecule, imagings and motion detections become possible. Pharmaceutical drug discovery, medical, genetic, cancer, and nanoscience low UV intensity and single UV photon imaging applications are enabled.

The foregoing disclosure and description of the invention are illustrative and explanatory thereof and various changes in the size, shape and materials, as well as in the details of the illustrated construction may be made without departing from the spirit of the invention.

The invention claimed is:

1. An avalanche photodiode semiconductor device of the type for converting an impinging photon into an electrical current comprising:
    a base n+ doped substrate composed of a first material and having a window section where the base n+ doped substrate has been removed for passing the photon impinging on the avalanche photodiode device;
    a first n– doped layer of said first material formed on top of the base n+ doped substrate and having a portion of a lower surface suitably exposed through the window section for receiving the photon impinging on the avalanche photodiode device;
    a second upper n+ doped layer of said first material formed on the first n– doped layer with the first n– doped layer located between the base n+ doped substrate and the second upper n+ doped layer;
    a third epitaxially grown p+ doped layer of said first material formed on top of the second upper n+ doped layer such that the second upper n+ doped layer is formed sandwiched between the first n– doped layer and the third epitaxially grown p+ doped layer;
    a pair of conductive metal contacts; and,
    at least one planar floating guard ring formed below the third epitaxially grown p+ doped layer, separated from the third epitaxially grown p+ doped layer, and doped at a level that is different than that of the third epitaxially grown p+ doped layer,
    wherein a first contact is formed with the base n+ doped substrate and a second contact is formed with the third epitaxially grown p+ doped layer.

2. The invention of claim 1 wherein the at least one planar floating guard ring is formed in the first n– doped layer and separated from the second upper n+ doped layer.

3. The invention of claim 2 wherein the first n– doped layer, the second upper n+ doped layer, and the third epitaxially grown p+ doped layer formed into a MESA configuration.

4. The invention of claim 2 wherein sloping sidewalls are formed on the edges of the first n– doped layer, the second upper n+ doped layer, and the third epitaxially grown p+ doped layer forming a mesa.

5. The invention of claim 2 wherein the lower portion of the first n– doped layer surface is exposed by an etch making the lower portion of the first n– doped layer surface antireflective.

6. The invention of claim 2 wherein the base n+ doped substrate is composed of Silicon Carbide (SiC).

7. The invention of claim 2 wherein sensitivity of the avalanche photodiode is the ultraviolet frequency range.

8. The invention of claim 2 including a passivation layer for providing electrical passivation and radiation hardness on a surface of the avalanche photodiode.

9. The invention of claim 2 wherein the photon impinges on the first n− doped layer of the avalanche photodiode and is absorbed in the first n− doped layer of the avalanche photodiode.

10. The invention of claim 2 wherein antireflective coatings are provided in the exposed portion of the lower surface of the first n− doped layer.

11. The invention of claim 2 wherein solar blind coatings are provided in the exposed portion of the lower surface of the first n− doped layer.

12. The invention of claim 2 wherein conductive metal contacts are formed from a material having a coefficient of thermal expansion that is within substantially 20% of a coefficient of thermal expansion of the avalanche photodiode's base n+ doped substrate.

13. The invention of claim 2 wherein a portion of the first n− doped layer extends above a top surface of the floating guard ring in the direction of the third epitaxially grown p+ doped layer.

14. The invention of claim 2 wherein the avalanche photodiode has a voltage breakdown determined by the thickness and dopings of a vertical stack of constituent layers.

15. The invention of claim 1 wherein the at least one planar guard ring is formed at least partially in the second upper n+ doped layer.

16. The invention of claim 15 wherein the second upper n+ doped layer and the third epitaxially grown p+ doped layer formed into a MESA configuration.

17. The invention of claim 15 wherein sloping sidewalls are formed on the edges of the second upper n+ doped layer and the third epitaxially grown p+ doped layer forming a mesa.

18. The invention of claim 15 wherein the lower portion of the first n− doped layer surface is exposed by an etch making the lower portion of the first n− doped layer surface antireflective.

19. The invention of claim 15 wherein the base n+ doped substrate is composed of Silicon Carbide (SiC).

20. The invention of claim 15 wherein sensitivity of the avalanche photodiode is the ultraviolet frequency range.

21. The invention of claim 15 including a passivation layer for providing electrical passivation and radiation hardness on a surface of the avalanche photodiode.

22. The invention of claim 15 wherein the photon impinges on the first n− doped layer of the avalanche photodiode and is absorbed in the first n− doped layer of the avalanche photodiode.

23. The invention of claim 19 wherein antireflective coatings are provided in the exposed portion of the lower surface of the first n− doped layer.

24. The invention of claim 19 wherein solar blind coatings are provided in the exposed portion of the lower surface of the first n− doped layer.

25. The invention of claim 19 wherein conductive metal contacts are formed from a material having a coefficient of thermal expansion that is within substantially 20% of a coefficient of thermal expansion of the avalanche photodiode's base n+ doped substrate.

26. The invention of claim 15 wherein a portion of the second upper n+ doped layer extends above the guard ring in the direction of the third epitaxially grown p+ doped layer.

27. The invention of claim 15 wherein the avalanche photodiode has a voltage breakdown determined by the thickness and dopings of a vertical stack of constituent layers.

28. An array structure comprising at least two avalanche photodiodes (APDs), wherein each avalanche photodiode comprises:
a base n+ doped substrate composed of a first material and having a window section where the base n+ doped substrate has been removed for passing the photon impinging on the avalanche photodiode device;
a first n− doped layer of said first material formed on top of the base n+ doped substrate and having a portion of a lower surface suitably exposed through the window section for receiving the photon impinging on the avalanche photodiode device;
a second upper n+ doped layer of said first material formed on the first n− doped layer with the first n− doped layer located between the base n+ doped substrate and the second upper n+ doped layer;
a third epitaxially grown p+ doped layer of said first material formed on top of the second upper n+ doped layer such that the second upper n+ doped layer is formed sandwiched between the first n− doped layer and the third epitaxially grown p+ doped layer; and,
a passivation layer for providing electrical passivation and radiation hardness on a surface of the avalanche photodiode
at least one planar guard ring formed in the first n− doped layer and separated from the second upper n+ doped layer and the third epitaxially grown p+ doped layer.

29. The array structure of claim 28 wherein the base n+ doped substrate is composed of Silicon Carbide (SiC).

30. The array structure of claim 28, wherein the avalanche photodiodes have uniform breakdown voltage.

31. The array structure of claim 28, where the APDs are biased to a same reverse voltage.

32. An array structure comprising at least two avalanche photodiodes (APDs), wherein each avalanche photodiode comprises:
a base n+ doped substrate composed of a first material and having a window section where the base n+ doped substrate has been removed for passing the photon impinging on the avalanche photodiode device;
a first n− doped layer of said first material formed on top of the base n+ doped substrate and having a portion of a lower surface suitably exposed through the window section for receiving the photon impinging on the avalanche photodiode device;
a second upper n+ doped layer of said first material formed on the first n− doped layer with the first n− doped layer located between the base n+ doped substrate and the second upper n+ doped layer;
a third epitaxially grown p+ doped layer of said first material formed on top of the second upper n+ doped layer such that the second upper n+ doped layer is formed sandwiched between the first n− doped layer and the third epitaxially grown p+ doped layer; and,
a passivation layer for providing electrical passivation and radiation hardness on a surface of the avalanche photodiode
at least one planar guard ring formed partially or in its entirety in the second upper n+ doped layer and separated from the third epitaxially grown p+ doped layer.

33. The array structure of claim 32 wherein the base n+ doped substrate is composed of Silicon Carbide (SiC).

34. The array structure of claim 32, wherein the avalanche photodiodes have uniform breakdown voltage.

35. The array structure of claim 32, where the APDs are biased to a same reverse voltage.

* * * * *